United States Patent
Yoshida et al.

(10) Patent No.: US 8,872,258 B2
(45) Date of Patent: Oct. 28, 2014

(54) SEMICONDUCTOR MEMORY DEVICE

(75) Inventors: Soichiro Yoshida, Tokyo (JP);
Yoshimitsu Yanagawa, Tokyo (JP);
Tomonori Sekiguchi, Tokyo (JP); Akira Kotabe, Tokyo (JP)

(73) Assignee: PS4 Luxco S.A.R.L., Luxembourg (LU)

( * ) Notice: Subject to any disclaimer, the term of this patent is extended or adjusted under 35 U.S.C. 154(b) by 38 days.

(21) Appl. No.: 13/359,453

(22) Filed: Jan. 26, 2012

(65) Prior Publication Data

US 2013/0193507 A1    Aug. 1, 2013

(51) Int. Cl.
*H01L 29/66*    (2006.01)

(52) U.S. Cl.
USPC ........................................ 257/329

(58) Field of Classification Search
USPC ........... 257/328, 329, 401; 438/268, 283, 284
See application file for complete search history.

(56) References Cited

U.S. PATENT DOCUMENTS

| | | | |
|---|---|---|---|
| 7,049,854 B2 * | 5/2006 | Brox | 327/51 |
| 7,457,156 B2 * | 11/2008 | Nazarian | 365/185.03 |
| 7,948,784 B2 | 5/2011 | Kajigaya | |
| 8,611,122 B2 | 12/2013 | Kajigaya | |
| 2008/0181026 A1 | 7/2008 | Nakaya et al. | |
| 2009/0061583 A1 * | 3/2009 | Wang | 438/268 |
| 2010/0142294 A1 * | 6/2010 | Carman | 365/191 |
| 2010/0213525 A1 * | 8/2010 | Masuoka et al. | 257/306 |
| 2010/0219483 A1 * | 9/2010 | Masuoka et al. | 257/369 |
| 2011/0127605 A1 * | 6/2011 | Kim | 257/334 |

FOREIGN PATENT DOCUMENTS

| | | |
|---|---|---|
| JP | H 3-285352 A | 12/1991 |
| JP | H 4-324676 A | 11/1992 |
| JP | H 5-41081 A | 2/1993 |
| JP | H 6-268173 A | 9/1994 |
| JP | 2008-186547 A | 8/2008 |
| JP | 2009-59735 A | 3/2009 |

* cited by examiner

*Primary Examiner* — Fernando L Toledo
*Assistant Examiner* — Bryan Junge
(74) *Attorney, Agent, or Firm* — McGinn IP Law Group, PLLC

(57) ABSTRACT

A semiconductor memory device includes: a sense amplifier; a plurality of memory cell arrays; a shared MOS transistor that connects/disconnects the sense amplifier and a bit line included in the memory cell arrays; and a control circuit that controls operation of the shared MOS transistor. A part or whole of an in-sense-amplifier bit line that is a bit line connecting the sense amplifier and the shared MOS transistor is embedded in a semiconductor substrate.

20 Claims, 25 Drawing Sheets

SEMICONDUCTOR MEMORY DEVICE

CROSS REFERENCE TO RELATED APPLICATIONS

The present application is related to Japanese Patent Application 2010-015327, filed on Jan. 27, 2010, incorporated herein by reference.

BACKGROUND OF THE INVENTION

1. Field of the Invention

The present invention relates to a semiconductor memory device including sense amplifiers.

2. Description of the Related Art

As a representative example of a semiconductor device including sense amplifiers, dynamic semiconductor memory devices are known. A sense amplifier is used to amplify a minute differential voltage corresponding to data stored in a memory cell from among the memory cells, and read the data, the differential voltage being output from paired bit lines connected to memory cells.

The semiconductor memory devices of recent years each have an enhanced integration density and an increased memory capacity, while further power consumption reduction and high speed operation are demanded. In order to reduce power consumption in a semiconductor memory device, it is effective to decrease the operating voltage of the inner circuit of the semiconductor memory device. For example, where an external power supply voltage of +1.8 V is supplied to a semiconductor memory device, an internal power supply voltage of +1.1 V may be generated by a step-down circuit to supply the internal power supply voltage to a memory cell array (including a plurality of memory cells, and, e.g., decoders for accessing the memory cells and sense amplifiers). An internal power supply voltage is a charge voltage corresponding to data "1" stored in a memory cell, and is also a high potential-side power supply voltage for a sense amplifier.

When an internal power supply voltage is decreased to decrease the charge voltage for bit lines, the operating voltage of a sense amplifier is also decreased in a known bit line ½ equalization method, resulting in an increase in sensing time. Sensing time is time required from the start of a sense amplifier to a point where a differential voltage (voltage difference) reaches a predetermined value at which the differential voltage can be regarded as being constant, after the differential voltage is output from a memory cell onto paired bit lines and amplified. Such a predetermined differential voltage is reached when, for example, a voltage on a high-side bit line reaches a value of 95% of an internal power supply voltage.

When reading data from a semiconductor memory device, in general, first, a word line is activated, and subsequently, memory cells are selected. A differential voltage corresponding to retained data is output onto respective paired bit lines from each of the memory cells. Then, sense amplifiers are started, and at the point of time when output values of the sense amplifiers are determined, data output from a sense amplifier from among the sensor amplifiers is selected by a column selection signal decoded by a column decoder and output to the outside. In other words, in order to properly read data from a memory cell, it is also necessary to set a time when a word line is selected to the time when data is selected by a column selection signal and is output, depending on the sensing time. This means that the longer the sensing time, the slower is the speed of reading data from the semiconductor memory device is.

As a method for solving such problem, for example, Japanese Patent Application Laid-open No. 2008-186547 discloses a method for reducing sensing time by providing shared MOS transistors that operate as switches between a sense amplifier and bit lines to shut off the bit lines and thereby reduce the load (capabilities of the bit lines) on the sense amplifier during amplification of a differential voltage by the sense amplifier. However, when the sense amplifier and a bit line are disconnected by a shared MOS transistor, the effect of noise resulting from a coupling capacity between a bit-line wiring between the shared MOS transistor and the sense amplifier (hereinafter referred to "in-sense-amplifier bit line") and a wiring adjacent to the in-sense-amplifier bit line (for example, another in-sense-amplifier bit line) is increased, which may result in inversion of amplified data or the occurrence of erroneous sensing. In particular, when an internal power supply voltage is decreased, differential voltages output from the respective paired bit lines to the sense amplifiers are also decreased, and thus, the possibility of erroneous sensing is increased. Japanese Patent Application Laid-open No. 2008-186547 discloses a technique for decreasing voltage applied to the gate of a shared MOS transistor SHR in two steps when a sense amplifier and a bit line are disconnected, in order to prevent such erroneous sensing.

In the aforementioned technique disclosed in Japanese Patent Application Laid-open No. 2008-186547, voltage applied to the gate of a shared MOS transistor is decreased in two steps, requiring a control circuit and a control wire for such two-step decrease. Accordingly, the size of the control circuit included in the semiconductor memory device is increased, and the addition of control wires, which may cause noise, increases the risk of causing the semiconductor memory device to malfunction.

For the semiconductor memory devices of recent years, a further density increase has been studied and their wiring widths and wiring pitches tend to be increasingly smaller in order to increase their memory capacities. Accordingly, it is desirable not to increase the size of the control circuit and the number of control wires to the greatest possible extent.

SUMMARY OF THE INVENTION

In one embodiment, there is provided a device that includes: a semiconductor substrate; first and second wiring layers formed in the semiconductor substrate; a first level wiring formed over the semiconductor substrate; third and forth wiring layers formed as the first level wiring; a first transistor including a first pillar element that comprises a first diffusion layer at one end thereof and a second diffusion layer at the other end thereof, and a first gate electrode that surrounds a part of the first pillar element, the first transistor being coupled to the first wiring layer at the first diffusion layer thereof and coupled to the third wiring layer at the second diffusion layer thereof, receiving a control signal at the first gate electrode thereof, the first transistor being rendered conductive when the control signal changes to a first logic level, and the first transistor being rendered nonconductive when the control signal changes to a second logic level, and a second transistor including a second pillar element that comprises a third diffusion layer at one end thereof and a fourth diffusion layer at the other end thereof, and a second gate electrode that surrounds a part of the second pillar element, the second transistor being coupled to the second wiring layer at the third diffusion layer thereof and coupled to the fourth wiring layer at the fourth diffusion layer thereof, the second transistor remaining conductive during a period of time when the device operates.

The above and other objects, features, and advantages of the present invention will become apparent from the following description with reference to the accompanying drawings, which illustrate examples of the present invention.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENT

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Figure 1A:
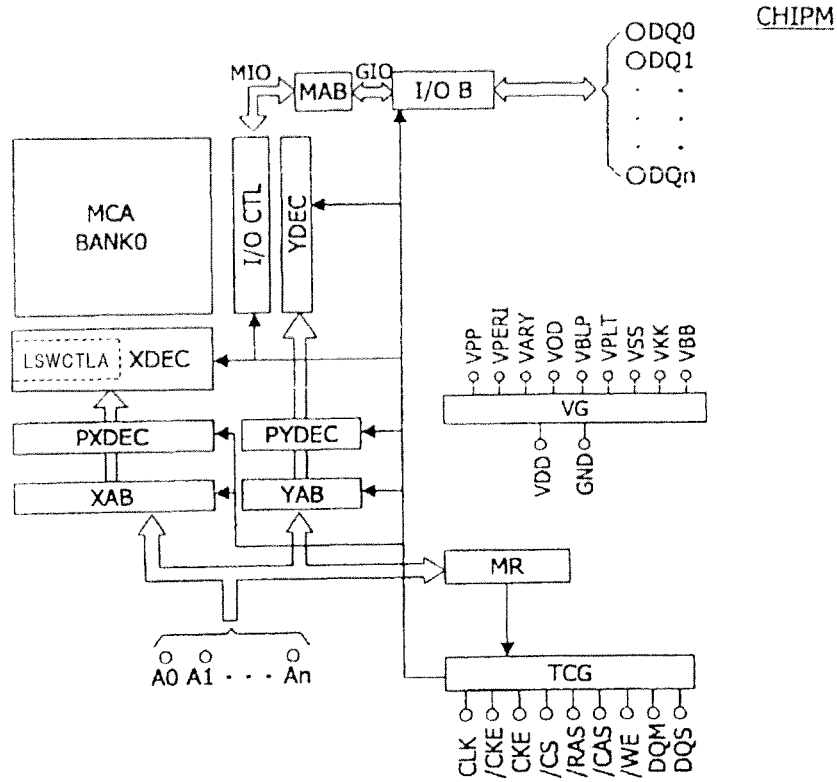
FIG. 1A is a block diagram illustrating an example configuration of a semiconductor memory device.

FIG. 1A is a block diagram illustrating an example configuration of a semiconductor memory device.

FIG. 1A illustrates an example configuration of a synchronous DRAM (SDRAM) as a semiconductor memory device CHIPM. The present invention is not limited to the SDRAM illustrated in FIG. 1A, but is applicable to, e.g., double data rate (DDR) SDRAMs having a data rate that is approximately twice that of SDRAMs, DDR2 SDRAMs having a data rate that is twice that of DDR SDRAMs, and DDR3 SDRAMs having a data rate that is twice that of DDR2 SDRAMs.

Each of circuit blocks illustrated in FIG. 1A operates according to an internal control signal generated in a timing generation circuit TCG. The timing generation circuit TCG includes a column timing control circuit and a row timing control circuit. Control signals input to the timing generation circuit TCG include a chip select signal /CS, a row address strobe signal /RAS, a column address strobe signal /CAS, and a write enable signal /WE. These control signals are input in synchronization with a clock signal CLK. Operating modes of a SDRAM, such as, e.g., a clock count of a column latency CL, an output data method and a write recovery clock count, are designated by various commands each including a combination of a control signal from among the aforementioned control signals and an address signal input from an address input terminal. The commands are retained by a mode register MR.

A clock enable signal CKE is a signal that designates whether to enable or disable the clock signal CLK. An input/output mask signal DQM is a signal that controls a data input/output buffer I/O_B that masks data input/output using input/output terminals DQ0, DQ1, . . . , DQn. A power generation circuit VG generates, e.g., a word line select voltage VPP, a peripheral circuit power supply voltage VPERI, an array voltage VARY, an overdrive voltage VOD, a bit line pre-charge voltage VBLP, a plate voltage VPLT, a word line non-select voltage VKK and a substrate voltage VBB based on an external power supply VDD and a ground potential VSS, which are externally supplied, and supplies the necessary voltages to the respective internal circuits.

SDRAMs employ an address multiplex method in which row address bits XA0, XA1, . . . , XAn and column address bits YA0, YA1, . . . , YAn are inputted to address input terminals A0, A1, . . . , An in a time-shared manner. The row address bits XA0, XA1, . . . , XAn that are input from the address input terminals to a row address buffer XAB are pre-decoded in an X pre-decoder PXDEC and then are decoded in a row address decoder XDEC. A certain word line in a memory array ARY is selected according to the result of the decoding, enabling data to be written/read to/from memory cells connected to the word line.

A layer switch controller LSWCTLA included in the row address decoder XDEC is a circuit that controls layer switches in a memory cell array MCA according to a result of decoding of a row address. Upon a column address being input into the column address buffer YAB subsequent to the input of the row address, the column address is pre-decoded in a Y pre-decoder PYDEC, and a memory cell from/to which data is read/written is selected according to the result of the decoding in the column address decoder YDEC.

An SDRAM ordinarily includes a plurality of memory arrays (or memory banks), which are designated by respective bank addresses. For example, a DDR2 SDRAM having a memory capacity of 1 Gb includes eight banks. FIG. 1A illustrates a memory cell array MCA (BANK0) as a representative of a plurality of banks included in the semiconductor memory device.

When data is read from the selected memory cell, data read from the memory cell is input via a main I/O line MIO to a main amplifier array MAB and amplified in the main amplifier array MAB. The amplified data is output to the outside of the semiconductor memory device CHIPM via a global I/O line GIO and the data input/output buffer I/O_B.

Meanwhile, when data is written to the selected memory cell, data input to the semiconductor memory device CHIPM is temporarily retained in the data input/output buffer I/O_B and input to the main amplifier array MAB via the global I/O line GIO and amplified in the main amplifier array MAB. The amplified data is input to the memory array ARY via the main I/O line MIO, and written to the selected memory cell.

Figure 1B:
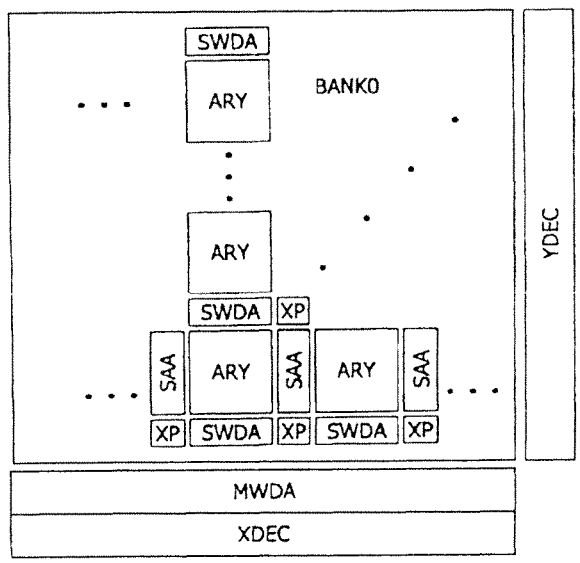
FIG. 1B is a schematic diagram illustrating an example arrangement of a memory block (bank) in the semiconductor memory device illustrated in FIG. 1A.

FIG. 1B illustrates an arrangement of a memory block (bank) in the semiconductor memory device illustrated in FIG. 1A.

A bank includes a memory region surrounded by a row address decoder XDEC that selects a word line based on a row address and a column address decoder YDEC that selects a data line based on a column address, and memory arrays ARY are arranged in a matrix in the memory region.

These memory arrays ARY are formed according to, for example, a hierarchical word line method, and at a side of memory arrays ARY, a main word driver array MWDA is arranged. Each main word line connected to the main word driver array MWDA is provided at a metal wiring layer, which is an upper layer formed so as to extend across a plurality of memory arrays ARY. In the memory arrays ARY, column select lines (YS lines) connected to the column address decoder YDEC are arranged so as to extend across a plurality of memory arrays ARY. The above-described configuration is called a common Y decoder method. A memory array ARY refers to a minimum memory array block surrounded by a sub word driver array SWDA including sub word drivers, a sense amplifier array SAA including sense amplifiers, and cross areas XP.

Figure 2:
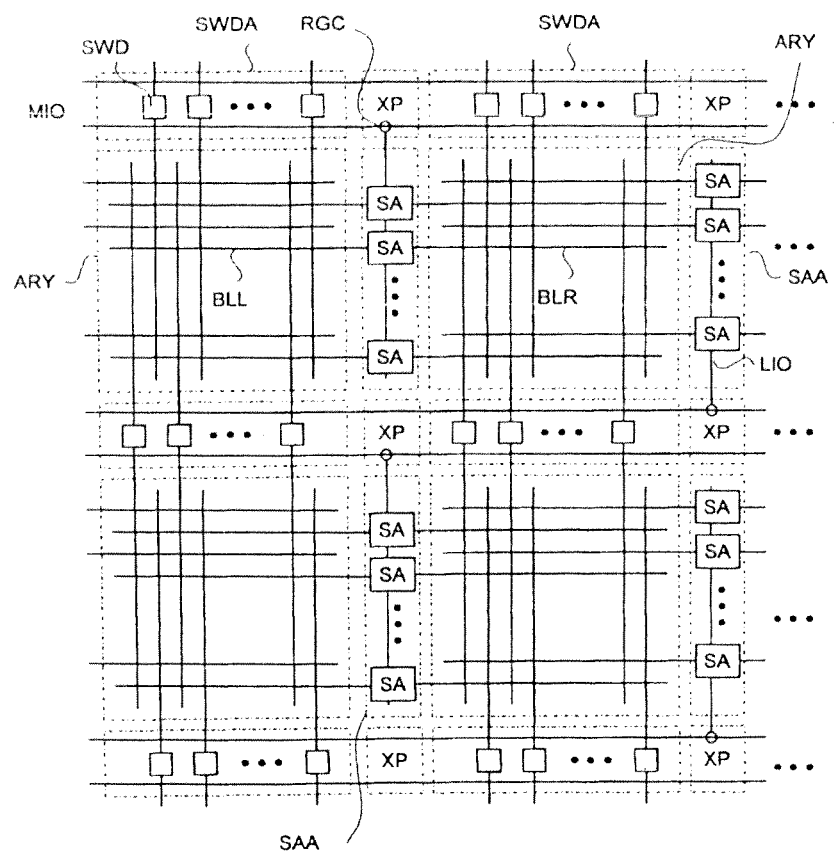
FIG. 2 is a plan diagram illustrating an example of a positional relationship between sense amplifier arrays and sub word driver arrays, which are illustrated in FIGS. 1A and 1B.

FIG. 2 is a plan diagram illustrating an example of a positional relationship between sense amplifier arrays and sub word driver arrays, which are illustrated in FIG. 1.

As illustrated in FIG. 2, the sense amplifier arrays SAA each include a plurality of sense amplifiers SA. The sense amplifier arrays SAA and the memory arrays ARY are alternately arranged (in the horizontal direction in FIG. 2), and to each sense amplifier SA, paired bit lines BLL/BLR in memory arrays ARY adjacent to the sense amplifier SA are connected. Such a configuration is called "open bit line architecture".

The sub word driver arrays SWDA each include a plurality of sub word drivers SWD. The sub word driver arrays SWDA and the memory arrays ARY are alternately arranged (in the vertical direction in FIG. 2), and to each sub word driver SWD, the word line WL in memory arrays ARY adjacent to the sub word driver SWD is connected. Arrangement of the respective sub word drivers SWD as described above enables the pitch of the sub word drivers SWD to be widened to be twice the pitch of the word lines WL in the memory arrays ARY. Thus, the sub word drivers SWD can be arranged at a high density, enabling enhancement of the integration density of the semiconductor memory device.

To each of the sense amplifier arrays SAA, a local I/O line LIO is connected, and the local I/O lines LIO are connected to the main I/O line MIO via a read/write gate RGC arranged at a cross area XP. During reading of data, data read from a memory cell by a sense amplifier SA is output to the outside of the SDRAM via the relevant local I/O line LIO and the relevant main I/O line MIO. Also, during writing of data, data input from the outside of the SDRAM is written to a memory cell by a sense amplifier SA via the relevant main I/O line MIO and the relevant local I/O line LIO.

Figure 3:
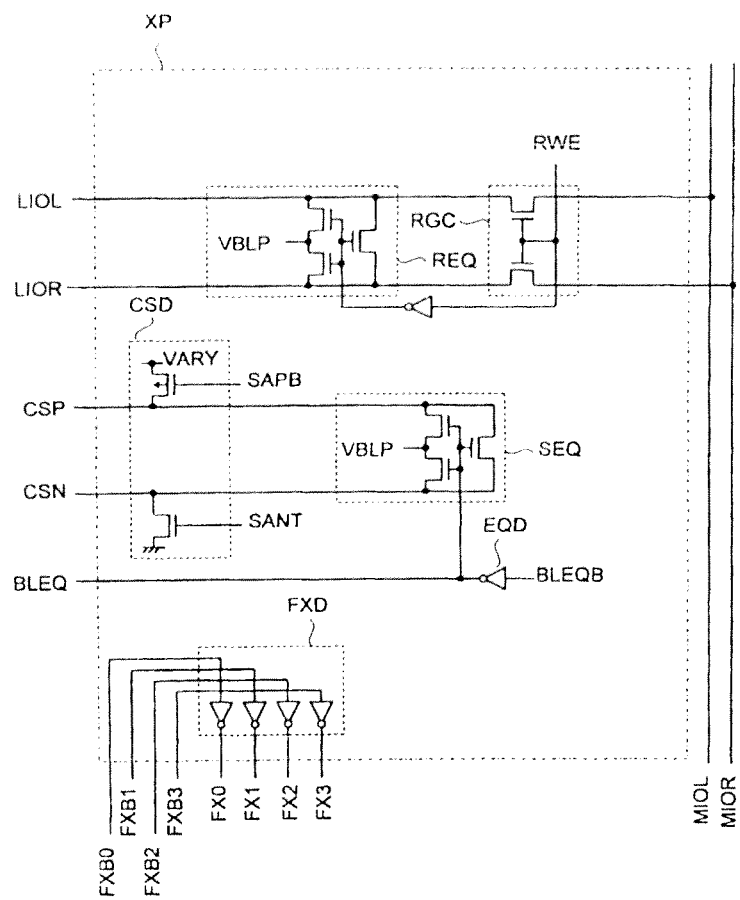
FIG. 3 is a circuit diagram illustrating an example configuration of a cross area included in a memory cell array, which is illustrated in FIGS. 1A and 1B.

FIG. 3 is a circuit diagram illustrating an example configuration of a cross area included in a memory cell array, which is illustrated in FIG. 1.

As illustrated in FIG. 3, a cross area XP includes a LIO line pre-charge circuit REQ, a read/write gate RGC, a common source line driver CSD, a common source line pre-charge circuit SEQ, a BLEQ signal driver EQD and an FX line driver FXD.

The LIO line pre-charge circuit REQ pre-charges local I/O lines LIOL and LIOR to a voltage VBLP when the read/write enable signal RWE is inactive (VSS).

The read/write gate RGC connects the local I/O line LIOL and the main I/O line MIOL, and connects the local I/O line LIOR and a main I/O line MIOR when the read/write enable signal RWE is active (voltage VPERI: the voltage VPERI is a voltage that is the same as an external power supply voltage VDD or a stepped-down voltage, and is used as a power supply voltage for a peripheral circuit).

The common source line driver CSD sets an n-side common source line CSN to a ground potential VSS when an n-side sense amplifier enable signal SANT is active, and sets a p-side common source line CSP to a voltage VARY (H level for a bit line) when a complementary signal SAPB for a p-side sense amplifier enable signal SAP is active (VSS).

The common source line pre-charge circuit SEQ pre-charges the p-side common source line CSP and the n-side common source line CSN to the voltage VBLP when a pre-charge signal BLEQ is active.

The BLEQ signal driver EQD receives an input of a complementary signal BLEQB for the pre-charge signal BLEQ, and outputs an inversion signal thereof. The FX line driver FXD receives an input of a signal FXB, and outputs a complementary signal for the signal FXB onto a sub word driver select line FX (FX line).

Figure 4:
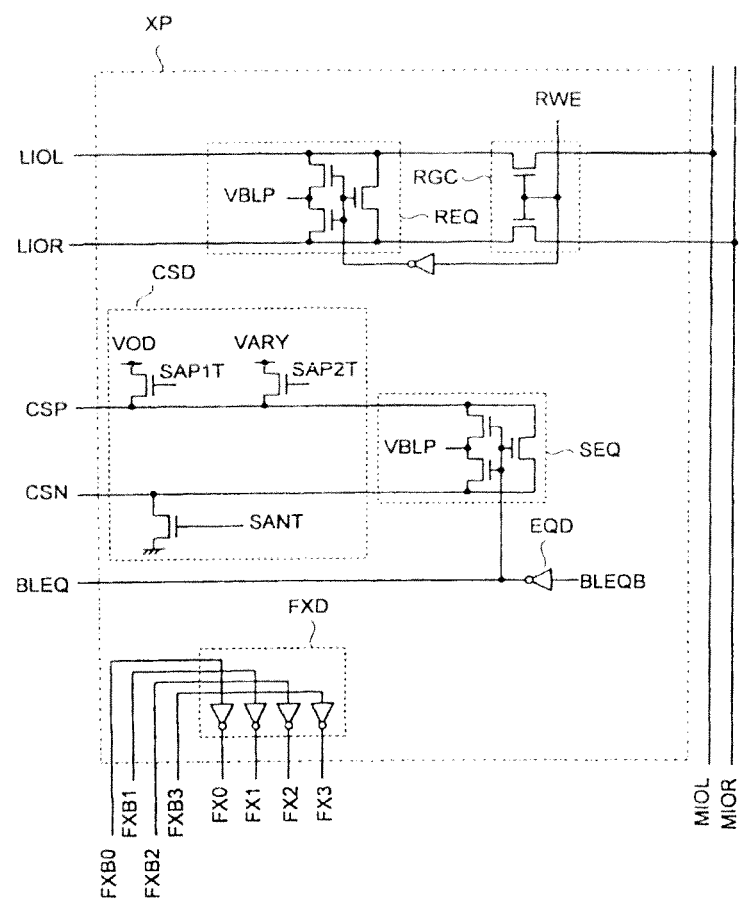
FIG. 4 is a circuit diagram illustrating another example configuration of a cross area in the memory cell array included in FIGS. 1A and 1B.

The common source line driver CSD may be configured so as to operate when the p-side common source line CSP for sense amplifiers are be set to two or more types of voltages. FIG. 4 is a circuit diagram illustrating an example configuration of a common source line driver CSD when a p-side common source line CSP is set to a voltage VARY (H level for a bit line) and a voltage VOD (for example, a voltage higher than the voltage VARY). In the common source line driver CSD illustrated in FIG. 4, when a signal SAP1T of p-side sense amplifier enable signals SAP is active (VPP), the p-side common source line CSP is set to the voltage VOD, and when another signal SAP2T of the p-side sense amplifier enable signals SAP is active (VPP), the p-side common source line CSP is set to the voltage VARY.

Figure 5:
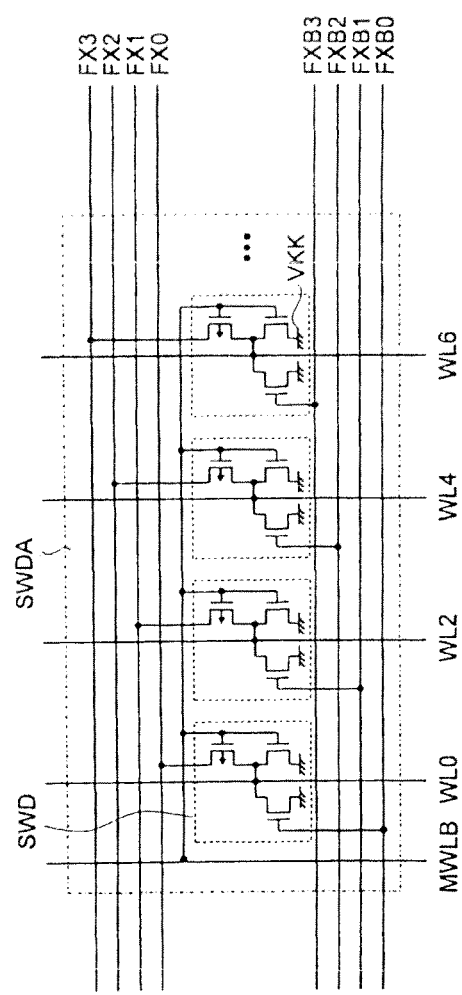
FIG. 5 is a circuit diagram illustrating an example configuration of a sub word driver array included in the semiconductor memory device illustrated in FIGS. 1A and 1B.

FIG. 5 is a circuit diagram illustrating an example configuration of a sub word driver array included in the semiconductor memory device illustrated in FIGS. 1A and 1B.

As illustrated in FIG. 5, a sub word driver array SWDA includes sub word drivers SWD. As illustrated in, e.g. FIG. 1B, the sub word driver array SWDA is arranged at a periphery of a memory array ARY.

The sub word driver SWD causes a word line WL in memory arrays ARY arranged adjacent to the sub word driver SWD (in the vertical direction) to transition to a predetermined voltage level to make memory cells connected to the word line WL enter an active state. Also, as illustrated in FIG. 2, the sub word driver arrays SWDA and the memory arrays ARY are alternately arranged, and thus, to each sub word driver SWD, every other word line WL (sub word line) in the memory arrays ARY adjacent to the sub word drivers SWD in the vertical direction is connected to the respective sub word drivers SWD.

As illustrated in FIG. 5, each sub word driver SWD includes two NMOS transistors and one PMOS transistor. One of the two NMOS transistors includes a gate connected to a main word line MWLB, a drain connected to a word line WL and a source to which a voltage VKK is supplied. The other NMOS transistor includes a gate connected to a complementary word driver select line FXB, a drain connected to a word line WL, and a source, to which the voltage VKK is supplied. The PMOS transistor includes a gate connected to the main word line MWLB, a drain connected to the word line WL, and a source connected to a sub word driver select line FX.

For one sub word driver array SWDA, four corresponding sub word driver select lines FX0 to 3 are provided, and a word line WL1 selected using the sub word driver select lines FX0 to 3 from among the four sub word drivers SWD selected by the main word line MWLB is activated.

Figure 6:
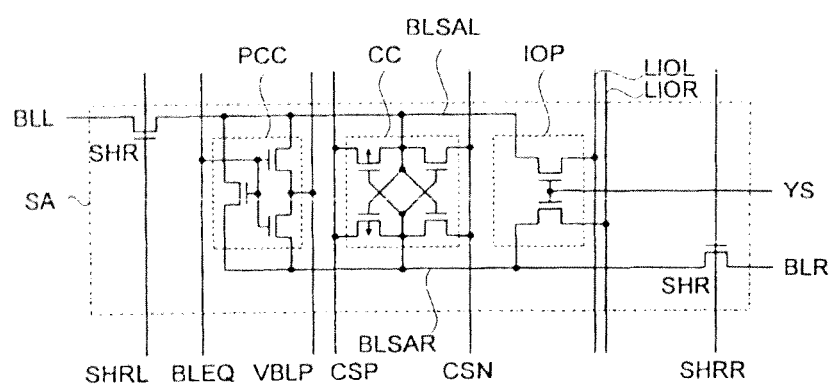
FIG. 6 is a circuit diagram illustrating an example configuration of a sense amplifier included in the semiconductor memory device illustrated in FIGS. 1A and 1B.

FIG. 6 is a circuit diagram illustrating an example configuration of a sense amplifier included in the semiconductor memory device illustrated in FIGS. 1A and 1B.

As illustrated in FIG. 6, a sense amplifier SA includes shared MOS transistors SHR, a pre-charge and equalization transistor PCC for in-sense-amplifier bit lines, a cross-coupled amplifier CC and a read/write port IOP.

When SHR drive signals SHRR and SHRL are active, the shared MOS transistors SHR operate as switches that connect a bit line BLL and an in-sense-amplifier bit line BLSAL and connect a bit line BLR and an in-sense-amplifier bit line BLSAR, respectively. The in-sense-amplifier bit lines BLSAL and BLSAR refer to wirings (bit lines) that connect the pre-charge and equalization transistor PCC for in-sense-amplifier bit lines, the cross-coupled amplifier CC and the read/write port IOP, the wirings being connected to the bit lines BLL and BLR via the shared MOS transistors SHR.

When a bit line pre-charge and equalization signal BLEQ is active, the pre-charge and equalization transistor PCC for in-sense-amplifier bit lines equalizes the paired in-sense-amplifier bit lines BLSAL and BLSAR, and also equalizes the bit lines BLL and BLR, and pre-charges the in-sense-amplifier bit lines BLSAL and BLSAR and the bit lines BLL and BLR to a bit line pre-charge voltage VBLP. The bit line pre-charge voltage VBLP is normally set to an intermediate voltage VARY/2 of an amplitude of the voltage VARY (a voltage that is the same as the external power supply voltage VDD or a stepped-down voltage thereof).

The cross-coupled amplifier CC is supplied with the voltage VARY (or a voltage VOD that is higher than the voltage VARY) from a p-side common source line CSP, and supplied with a ground potential VSS from an n-side common source line CSN.

The cross-coupled amplifier CC includes two inverters each including an n-channel transistor and a p-channel transistor, an output of one of the inverters being fed back to an input of another of the inverters. Upon occurrence of a minute differential voltage corresponding to data stored in a memory cell MC, between the bit lines BLL and BLR, and between the in-sense-amplifier bit lines BLSAL and BLSAR, from among the in-sense-amplifier bit lines BLSAL and BLSAR, the cross-coupled amplifier CC amplifies the voltage of one in-sense-amplifier bit line having a higher voltage to the voltage VARY ("H" level for the bit line) or the voltage VOD (over-drive voltage), and amplifies the voltage of the other bit line having a lower voltage to the voltage VSS ("L" level for the bit line) and latches the amplified voltages.

When a column select line YS is active, the read/write port IOP connects a local IO line (LIO line) LIOL and the in-sense-amplifier bit line BLSAL, and connects a local IO line (LIO line) LIOR and the in-sense-amplifier bit line BLSAR. A voltage of each of the local IO lines LIOL and LIOR is retained at the pre-charge level VBLP during standby mode, in order to suppress current consumption by non-selected sense amplifier arrays SAA.

Figure 7A:
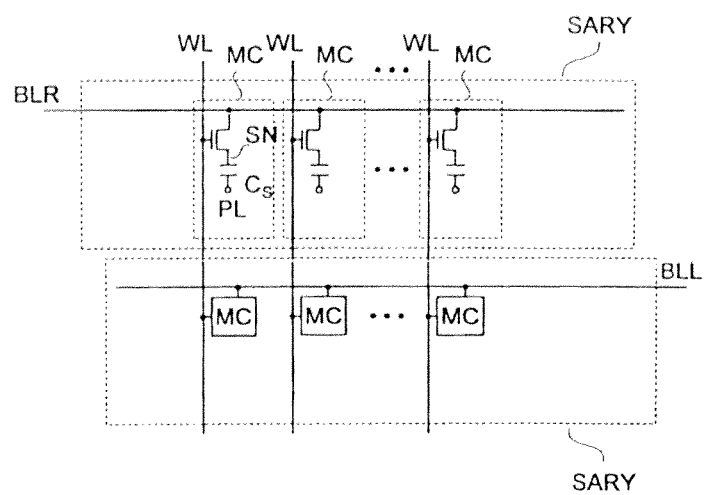
FIGS. 7A and 7B are schematic diagrams each illustrating an example configuration of two adjacent sub memory array portions in the memory array portion illustrated in FIGS. 1A and 1B.
Figure 7B:
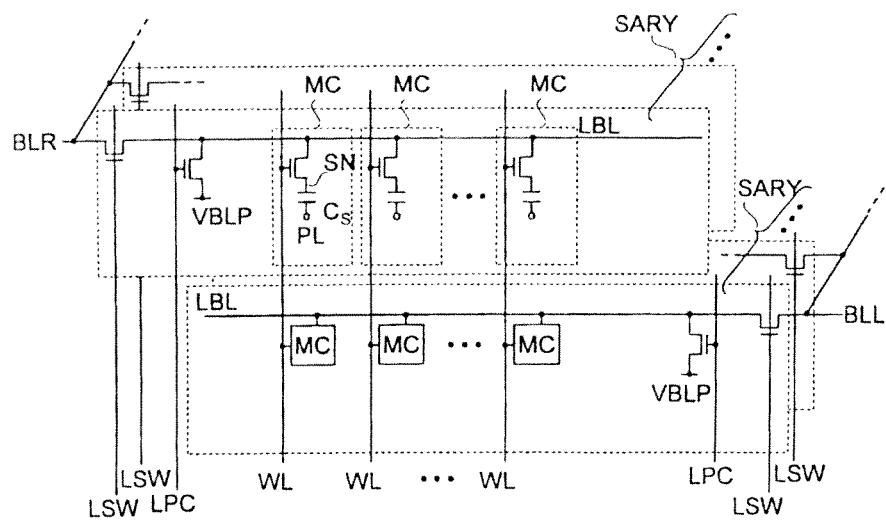

FIGS. 7A and 7B are schematic diagrams illustrating an example configuration of two adjacent sub memory arrays SARY in a memory array ARY, which is illustrated in FIGS. 1A and 1B. FIG. 7A illustrates an example array configuration in which a plurality of memory cells MC is connected to each of bit lines BLL and BLR; and FIG. 7B illustrates an example array configuration in which a plurality of sub bit lines LBL is connected to each of bit lines BLL and BLR via layer switch transistors LSW, and a plurality of memory cells MC is connected to each of the sub bit lines LBL.

In such hierarchal bit line configuration as illustrated in FIG. 7B, only a sub bit line connected to a selected cell is connected to the bit line BL by controlling the layer switch transistors LSW, the bit line capacity for sensing is reduced, enabling the number of memory cells that can be connected to the bit line BL to be increased. In other words, if the same bit line capacity is provided, the number of sense amplifiers can be reduced compared to that of the array configuration illustrated in FIG. 7A, thus providing an advantage in that the area of the chip can be reduced.

A hierarchal bit line-type sub memory array SARY such as illustrated in FIG. 7B requires a plurality of memory cells MC, a plurality of sub bit lines LBL, layer switch transistors LSW that connect the respective sub bit lines LBL to a main bit line and wirings for drive signals for the layer switch transistors LSW, and transistors for pre-charging the sub bit lines LBL and wirings for drive signals LPC for the transistors. Each memory cell MC is a known DRAM memory cell including an MOS transistor (memory cell transistor) and capacitor Cs.

One of a source and a drain of the memory cell transistor is connected to a sub bit line LBL, and the other of the source and the drain is connected to a storage node SN, and a gate of the memory cell transistor is connected to a word line WL. A terminal of the capacitor Cs is connected to the storage node SN and another terminal of the capacitor Cs is connected to a common plate PL.

The common plate PL is supplied with a plate voltage VPLT. As described above, the semiconductor memory device illustrated in FIGS. 1A and 1B and 7A and 7B includes memory cell arrays having an open bit line architecture, and thus, a memory cell can be arranged at each of all the intersection between the word lines and the bit lines. Thus, the size of the memory cell arrays can be reduced. The memory cell transistor includes, for example, a vertical transistor using a silicon pillar. A configuration of a vertical transistor is described in, for example, Japanese Patent Application Laid-open No. 2009-10366.

Hereinafter, a basic operation of the semiconductor memory device according to the present exemplary embodiment will be described with reference to FIGS. 8 and 9.

Figure 8:
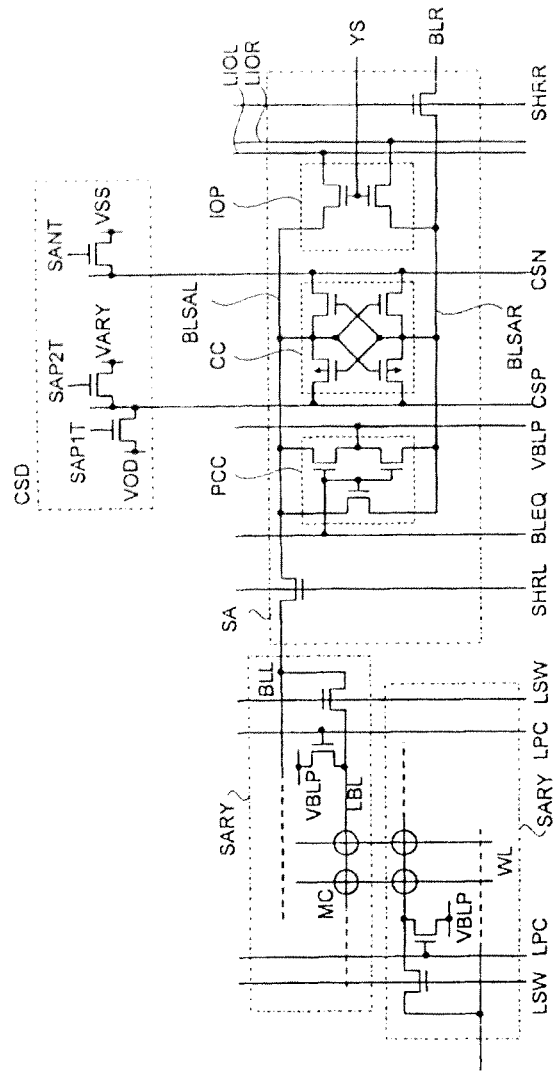
FIG. 8 is a circuit diagram illustrating sub arrays including selected memory cells, a sense amplifier connected to a selected memory cell, and a common source line driver in the semiconductor memory device illustrated in FIG. 1A and 1B.

FIG. 8 is a circuit diagram illustrating sub arrays SARY including selected memory cells MC, a sense amplifier SA connected to a selected memory cell and a common source line driver CSD extracted from the semiconductor memory device illustrated in FIGS. 1A and 1B to 7A and 7B.

The semiconductor memory device according to the present exemplary embodiment has a configuration in which in-sense-amplifier bit lines BLSAL and BLSAR are embedded in a semiconductor substrate. In such a configuration, a PWEL region or a NWEL region, which is supplied with power, exists between the in-sense-amplifier bit lines BLSAL and BLSAR. The PWEL region or the NWEL region electrostatically shield the in-sense-amplifier bit lines BLSAL and BLSAR from each other, thereby reducing the coupling capacity between the in-sense-amplifier bit lines BLSAL and BLSAR.

Although the present exemplary embodiment has been described in terms of an example in which the cell arrays SARY have the hierarchal bit line structure illustrated in FIG. 7B, a structure in which in-sense-amplifier bit lines BLSAL and BLSAR are embedded in a substrate can be applied to a memory array having no hierarchal structure, which is illustrated in FIG. 7A, except the layer switches and control of bit line pre-charge signals.

Figure 9:
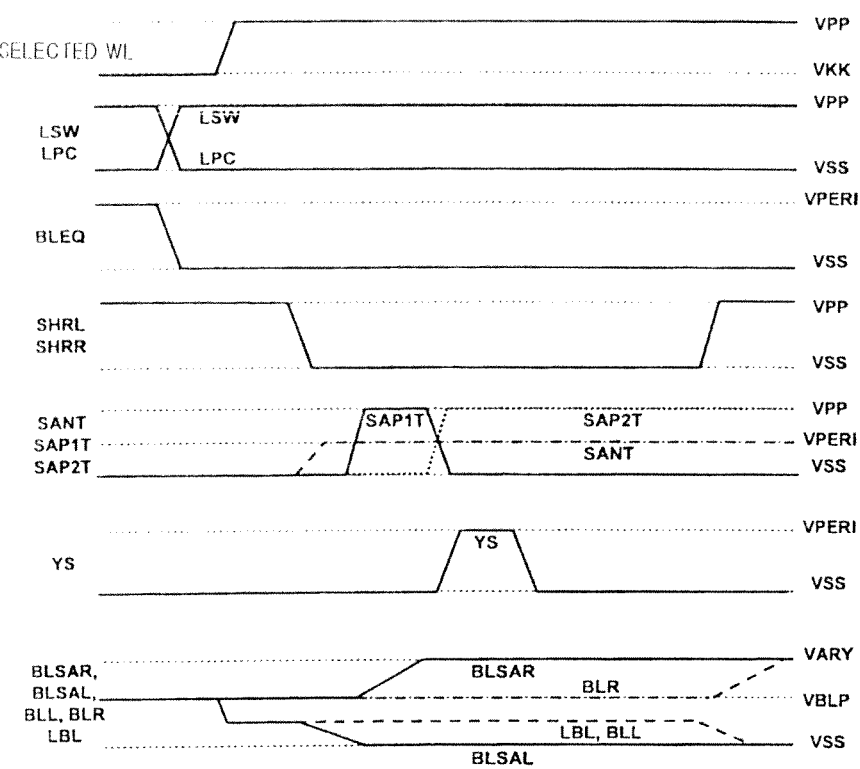
FIG. 9 is a waveform diagram illustrating status of respective signals when data is read from a selected memory cell.

FIG. 9 is a waveform diagram illustrating status of respective signals when data is read from a selected memory cell. An operation of the memory array illustrated in FIG. 8 will be described with reference to FIG. 9.

When data is read from a memory cell MC, first, the voltage level of a layer switch control line LSW connected to a sub bit line LBL connected to a selected memory cell is changed from VSS, which is a standby voltage level, to a stepped-up level VPP, and the sub-bit line LBL and a bit line BLL are connected. Here, shared MOS transistor control lines SHRL and SHRR are at a stepped-up level VPP, and the bit line BLL is connected to an in-sense-amplifier bit line BLSAL, and a bit line BLR is connected to an in-sense-amplifier bit line BLSAR.

Subsequently, when a word line WL connected to the selected memory cell is activated, a differential voltage corresponding to data stored in the selected memory cell is generated in the sub-bit line LBL, the bit line BLL and the in-sense-amplifier bit line BLSAL. At the point of time when the differential voltage has sufficiently been generated, the shared MOS transistor control signals SHRR and SHRL are returned to the standby voltage level VSS, thereby disconnecting the bit line BLL and the in-sense-amplifier bit line BLSAL, and also disconnecting the bit line BLR and the in-sense-amplifier bit line BLSAR.

Next, after a control signal SANT for a sense amplifier circuit SA is activated, the signals SAP1T and SAP2T are sequentially activated, and the differential voltage generated between the in-sense-amplifier bit lines BLSAL and BLSAR in accordance with the data stored in the memory cell is amplified. As a result of completion of the amplification, data output from the memory cell is determined, and thus, a column select switch YS is activated to output the determined data to paired local IO lines LIOL and LIOR.

Data output onto the local IO lines is output to the outside of the memory chip via the main IO line MIO, the main amplifier buffer MAB, a global IO line GIO and the data input/output buffer I/O_B.

Furthermore, concurrently with reading of the data, the shared MOS transistor control signals SHRL and SHRR are made to transition to the stepped-up level VPP to write the determined data back to the memory cell MC via the bit lines BLL and LBL.

As described above, in the semiconductor memory device according to the present exemplary embodiment has an open bit line architecture in which when data read from a memory cell is amplified, the bit lines BLL and BLR are disconnected from the in-sense-amplifier bit lines, eliminating the need to provide a reference-side bit line (BLR in this example), which has conventionally been required for maintenaning of capacitive balance during amplification to perform stable data reading.

In the semiconductor memory device described above as the related art, when bit lines are disconnected to amplify read data, the capacity of the bit lines becomes small, and a coupling capacity between the in-sense-amplifier bit lines is relatively increased, which may result in the occurrence of erroneous sensing.

Meanwhile, in the semiconductor memory device according to the present exemplary embodiment, the in-sense-amplifier bit lines are embedded in the semiconductor substrate, whereby the in-sense-amplifier bit lines BLSAL and BLSAR are electrostatically shielded from each other, reducing the coupling capacity between the in-sense-amplifier bit lines BLSAL and BLSAR. Thus, erroneous sensing by the sense amplifier is reduced.

The effect of eliminating the need to provide a reference-side bit line will be described below with reference to FIGS. 10A and 10B.

Figure 10A:
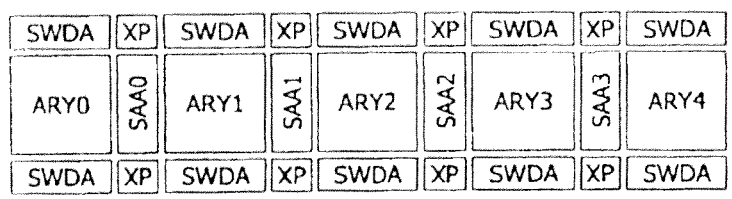
FIGS. 10A and 10B are schematic diagrams each illustrating an example arrangement of memory arrays included in the semiconductor memory device illustrated in FIGS. 1A and 1B.

FIG. 10A illustrates an example array arrangement for a case where a reference-side bit line is required, that is, a normal open bit line architecture.

In the array configuration illustrated in FIG. 10A, in terms of the number of arrays in the bit line direction, one bank includes five memory arrays. In this case, four sense amplifier arrays SAA0 to 3 are required.

Figure 10B:
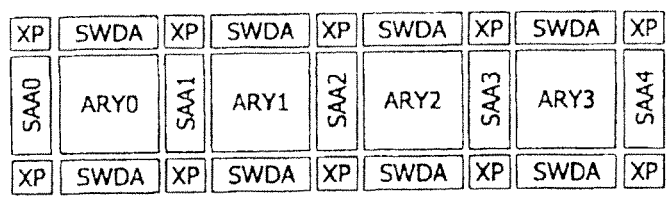

Meanwhile, if there is no need to provide the reference-side bit line, an array arrangement such as illustrated in FIG. 10B can be provided. In this case, one bank includes four memory cell array ARY0 to 3, which are decreased by one compared to the example configuration in FIG. 10A, and the bank also includes five sense amplifiers SAA0 to 4, which are increased by one compared to the example configuration illustrated in FIG. 10A. In general, bit lines have a length larger than the width of sense amplifier arrays, and thus, the array configuration illustrated in FIG. 10B enables more layout area reduction. In other words, the area of the memory chips in a semiconductor memory device that employs an open bit line architecture can be reduced.

Figure 11:
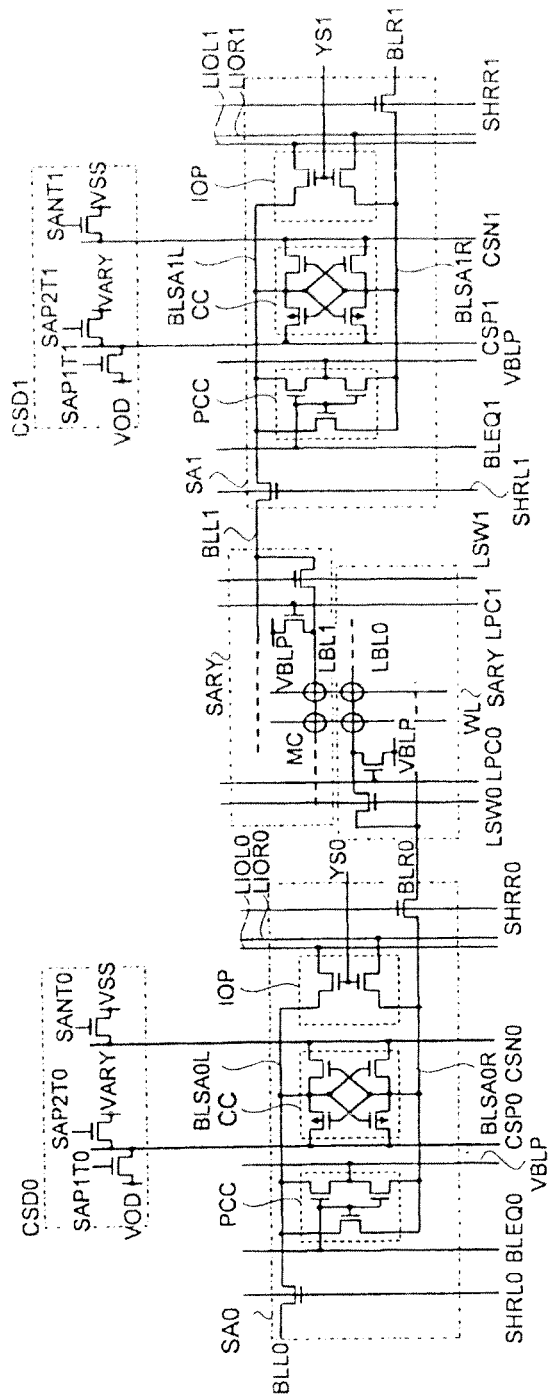
FIG. 11 is a circuit diagram illustrating an example configuration of an array of sub arrays, sense amplifiers and common source line source drivers extracted from the semiconductor memory device illustrated in FIGS. 1A and 1B.

FIG. 11 is a diagram illustrating an example of an open bit line architecture using a time-shared drive circuit method, in which an array of sub arrays SARY that are activated by a selected word line WL, sense amplifiers SA0 and SA1 on both sides of the sub arrays SARY and common source line drivers CSD are extracted from among the semiconductor memory device illustrated in FIGS. 1A and 1B to 7A and 7B.

The circuit configuration illustrated in FIG. 11 is different from the circuit configuration illustrated in FIG. 8 in that, for example, two n-side sense amplifier enable signals SANT0 and SANT1 are provided as control signals for controlling sense amplifier circuits to control two sense amplifiers connected to a memory array independently from each other in terms of timing. The rest of the configuration is basically identical to that of the configuration illustrated in FIGS. 1A and 1B to 8.

Figure 12:
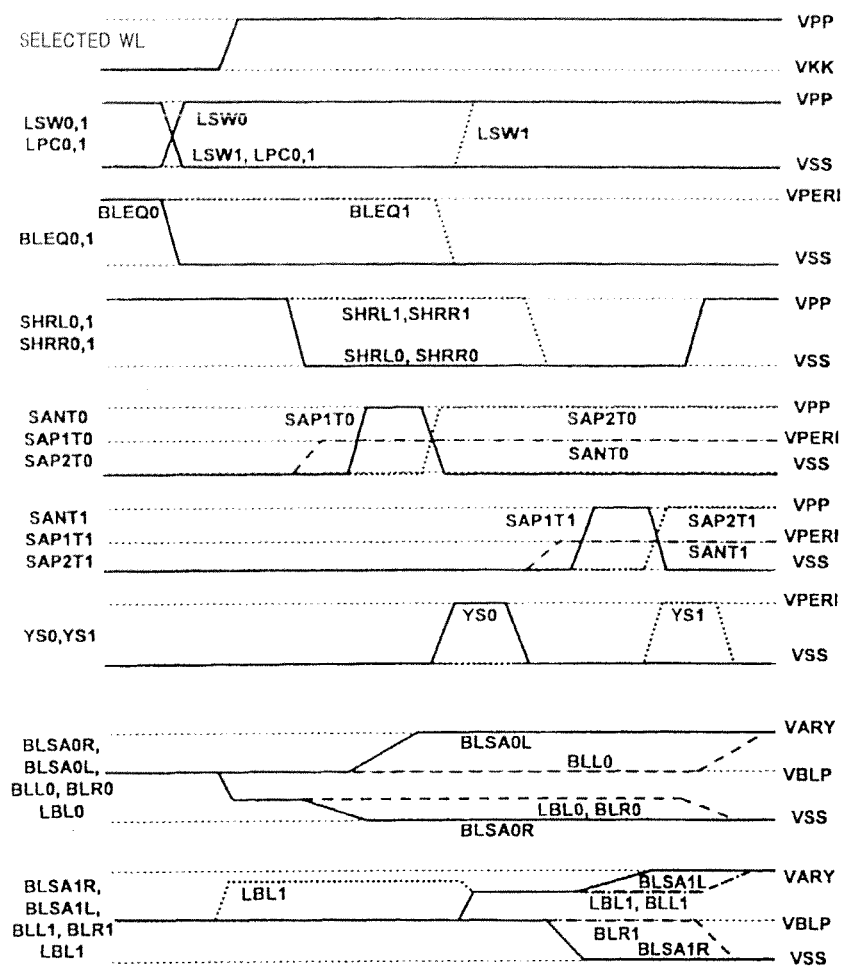
FIG. 12 is a timing chart illustrating an example of operation of the circuit illustrated in FIG. 11.

FIG. 12 is a diagram illustrating an example of a time-shared drive method in the semiconductor memory device having an open bit line architecture illustrated in FIG. 11.

In the example illustrated in FIG. 12, a layer switch control line LSW0 from among a plurality of layer switch control lines is made to transition from a standby voltage level VSS to a stepped-up level VPP, thereby connecting a sub-bit line that is connected to a selected memory cell and a bit line BLR0.

Meanwhile, when a layer switch control line LSW1 is made to enter an inactive state, and sub-bit line pre-charge control signals LPC0 and LPC1 are made to enter an inactive state. Here, shared MOS transistor control lines SHRL0, SHRR0, SHRL1 and SHRR1 are at the stepped-up level VPP, a bit line BLL0 is connected to an in-sense-amplifier bit line BLSA0L, a bit line BLR0 is connected to an in-sense-amplifier bit line BLSA0R, a bit line BLL1 is connected to an in-sense-amplifier bit line BLSA1L, and a bit line BLR1 is connected to an in-sense-amplifier bit line BLSA1R.

Next, when a word line WL is activated, differential voltages corresponding to data stored in selected memory cells are output to sub bit lines LBL0 and LBL1, the bit line BLR0 and the in-sense-amplifier bit line BLSA0R. The bit line BLL1 and the in-sense-amplifier bit line BLSA1L are clamped at a bit line pre-charge voltage VBLP because a bit line equalization signal BLEQ1 is active. As a result of the aforementioned control, the potential of a bit line from which a signal is read which is a signal that is read while a word line is being activated and the potential of the bit line that is adjacent to that bit line are clamped. Thus, the bit lines BLR0 and BLL1 are electrostatically shielded from each other, suppressing erroneous sensing caused by the coupling capacity between the bit lines BLR0 and BLL1.

At a point of time when the differential voltage stored in the memory cell has sufficiently been output, the shared MOS transistor control signals SHRR0 and SHRL0 are returned to the standby voltage level VSS, thereby disconnecting the bit line BLR0 and the in-sense-amplifier bit line BLSA0R.

Next, a control signal SANT0 for a sense amplifier circuit SA0 is activated, and signals SAP1T0 and SAP2T0 are sequentially activated to amplify the differential voltage output from the memory cell to the in-sense-amplifier bit lines BLSA0L and BLSA0R. Consequently, half of the in-sense-amplifier bit lines in the selected memory array are subjected to amplification. As a result of sufficient amplification, the read data is determined, and a column select switch YS0 is activated, thereby data is output to paired local IO lines LIOL0 and LIOR0.

Next, the bit line equalization signal BLEQ1 is made to enter an inactive state, the layer switch control line LSW1 is activated to connect the sub-bit line LBL1 and the bit line BLL1, and the read signal in the selected sub-bit line LBL1, which has not been amplified yet, is transferred to the bit line BLL1 and the in-sense-amplifier bit line BLSA1L. At a point of time when the transfer of the data has been completed, the shared MOS transistor control signals SHRR1 and SHRL1 are returned to the standby voltage level VSS, the control signal SANT1 for the sense amplifier circuit SA1 is activated, signals SAP1T1 and SAP2T1 are sequentially activated, and the differential voltage output from the memory cell to the in-sense-amplifier bit lines BLSA1L and BLSA1R are amplified. At a point of time when the differential voltage has sufficiently been amplified, the read data is determined, and a column select switch YS1 is activated to output the data to paired local IO lines LIOL1 and LIOR1.

Lastly, the shared MOS transistor control signals SHRL0, SHRR0, SHRL1 and SHRR1 are set to the stepped-up level VPP, and the determined data are written back to the cells via the bit lines BLR0 and BLL1.

As described above, the semiconductor memory device according to the present exemplary embodiment enables reduction of coupling capacity between bit lines during data reading in an open bit line architecture. In other words, noise generated as a result of change in the potential of adjacent bit lines can be reduced, and thus, the operating margin is expanded. Thus, the semiconductor memory device can be made to operate at a lower voltage. However, since a differential voltage output to a bit line is amplified twice according to a time-shared method, a long time may be required for reading data. For a countermeasure to such problem, a column address to be accessed is acquired in advance using, for example, a known Posted CAS method applied to SDRAMs from DDR2 onwards. As described above, a sense amplifier array for a column address to be accessed is activated in advance, a column select switch is activated as a point of time when amplification for bit lines in the sense amplifiers has been completed, the data accessed first can be read at high speed, enabling reduction in overhead caused by time-shared driving.

Figure 13:
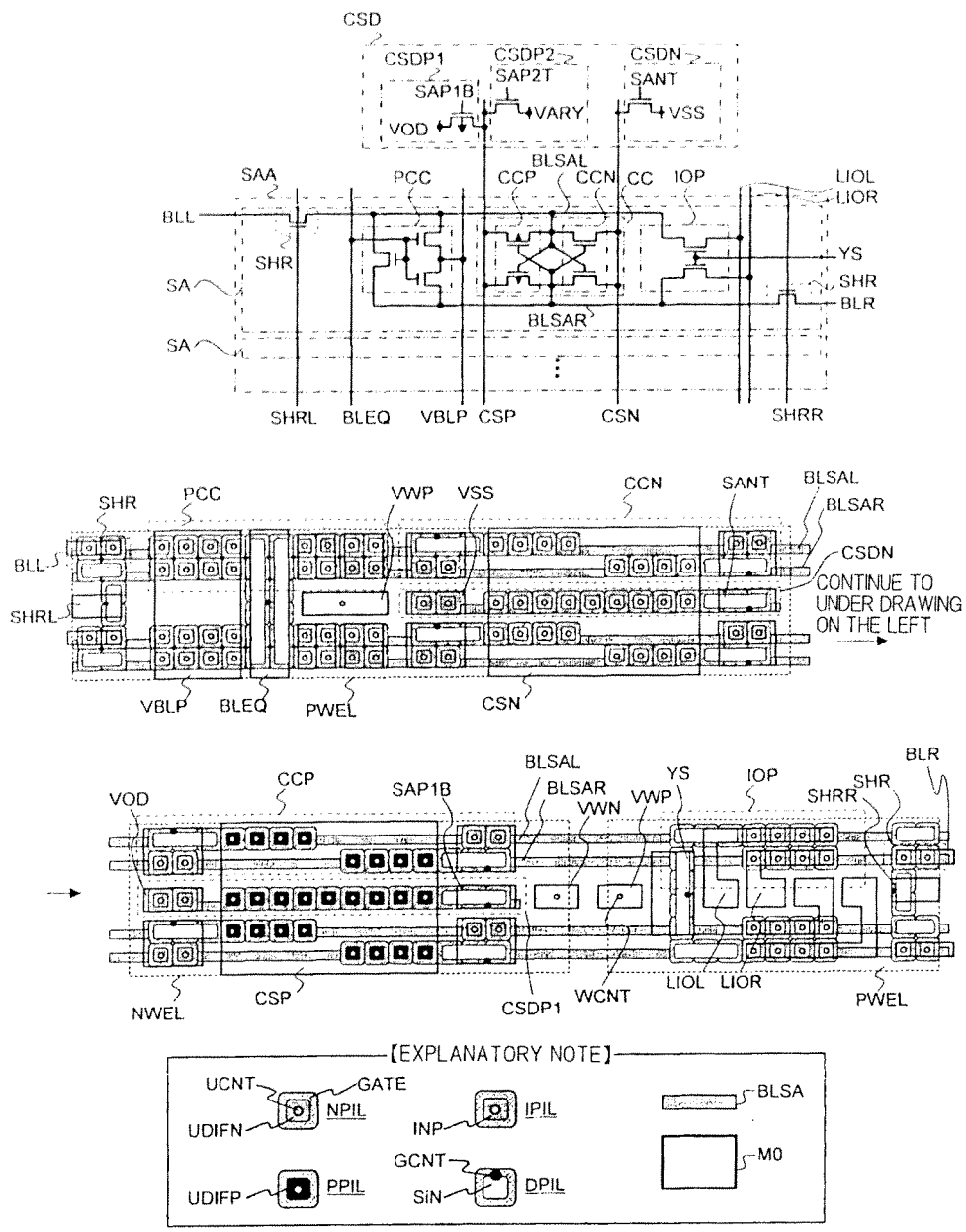
FIG. 13 is a schematic diagram illustrating an example layout of sense amplifiers, bit lines and in-sense-amplifier bit lines, which are illustrated in FIGS. 1A and 1B.

FIG. 13 illustrates a sense amplifier circuit diagram, and an example of a planar layout where all of in-sense-amplifier bit lines BLSAL and BLSAR are embedded. Each symbol that indicates a part surrounded by an alternate long and two short dashes line in FIG. 13 corresponds to the respective symbol in the circuit diagram.

A sense amplifier includes two PWEL regions indicated by dotted lines, and an NWEL region therebetween. In each of the WEL regions, in-sense-amplifier bit lines BLSAL and BLSAR are embedded, and vertical transistors using silicon pillars are formed thereon.

Figure 21:
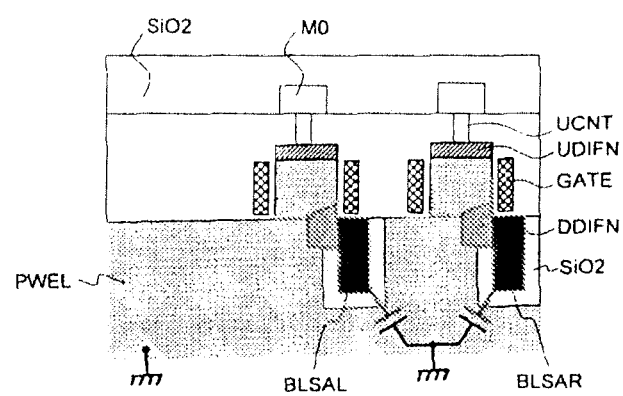
FIG. 21 is a side-view diagram illustrating an example structure of the in-sense-amplifier bit lines and the shared MOS transistors illustrated in FIG. 6.

FIG. 21 illustrates an example of a structure of pillar transistors and in-sense-amplifier bit lines in a PWEL region.

As illustrated in FIG. 21, in-sense-amplifier bit lines and pillar transistors are connected in a lower diffusion layer DDIFN of the pillar transistors. There is a PWEL region supplied with power, between the in-sense-amplifier bit lines BLSAL and BLSAR, and thus, the in-sense-amplifier bit lines BLSAL and BLSAR are electrostatically shielded from each other by the PWEL region. Thus, coupling capacity between the in-sense-amplifier bit lines BLSAL and BLSAR is reduced, and erroneous sensing by the sense amplifier is thereby reduced. Accordingly, data can be stably read from a memory cell by a sense amplifier without any increase in size and without any increase in the number of control lines.

PWEL in FIG. 13 indicates a p-well region, and NWEL indicates an n-well region. VWP denotes a line of power supply to a p-well region and VWN denotes a line of power supply to the n-well region. M0 denotes a first tungsten wiring layer, and WCNT denotes a contact connecting a well and M0. Also, NPIL denotes an n-channel pillar transistor and PPIL denotes a p-channel pillar transistor PPIL, IPIL denotes a pillar transistor for contact with an in-sense-amplifier bit line, and DPIL denotes a dummy pillar transistor for contact with a gate. IPIL is used as a contact for connecting an embedded in-sense-amplifier bit line and a M0 wiring at a layer above the in-sense-amplifier bit line. Such use of pillar transistors for contacts enables in-sense-amplifier bit lines embedded in a narrow pitch and bit lines to be easily connected.

Each pillar transistor includes a gate electrode GATE, an upper diffusion layer contact UCNT, an upper n+ diffusion layer UDIFN, an upper p+ diffusion layer UDIFP, a high-concentration ion-doped layer INP, a gate electrode contact GCNT and a silicon nitride film SIN. Here, a plurality of pillar transistors connected in parallel is used. Consequently, the drive performance can be enhanced and variations in characteristics of pillar transistors arising in manufacturing process can be reduced.

Figure 23:
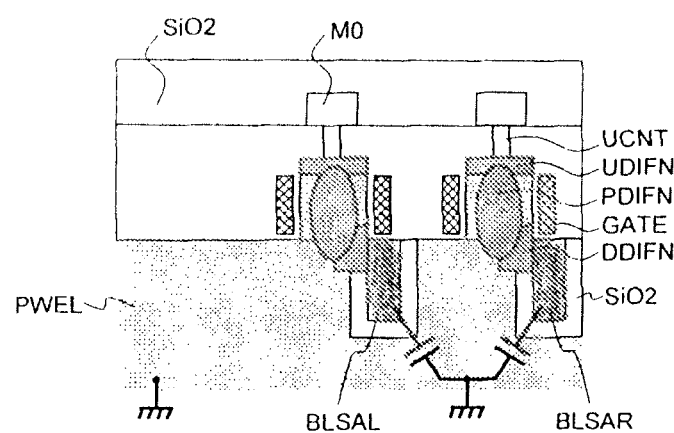
FIG. 23 is a cross-sectional side-view diagram illustrating an example structure of pillar transistors for making contact with in-sense-amplifier bit lines, which are illustrated in FIG. 13.

FIG. 23 illustrates an example of a structure of pillar transistors IPIL that make contact with in-sense-amplifier bit lines. The pillar transistors IPIL illustrated in FIG. 23 are different from those illustrated in FIG. 21 in that a diffusion layer PDIFN is formed in a silicon pillar by adding impurities into the silicon pillar. The rest of configuration is substantially identical to that of the pillar transistors in FIG. 21. Each pillar transistor IPIL illustrated in FIG. 23 includes the diffusion layer PDIFN in the silicon pillar, enabling the upper diffusion layer UDIFN and the lower diffusion layer DDIFN to be consistently electrically connected. Consequently, embedded in-sense-amplifier bit lines BLSAL and BLSAR can be each connected to a first tungsten layer M0.

Figure 24:
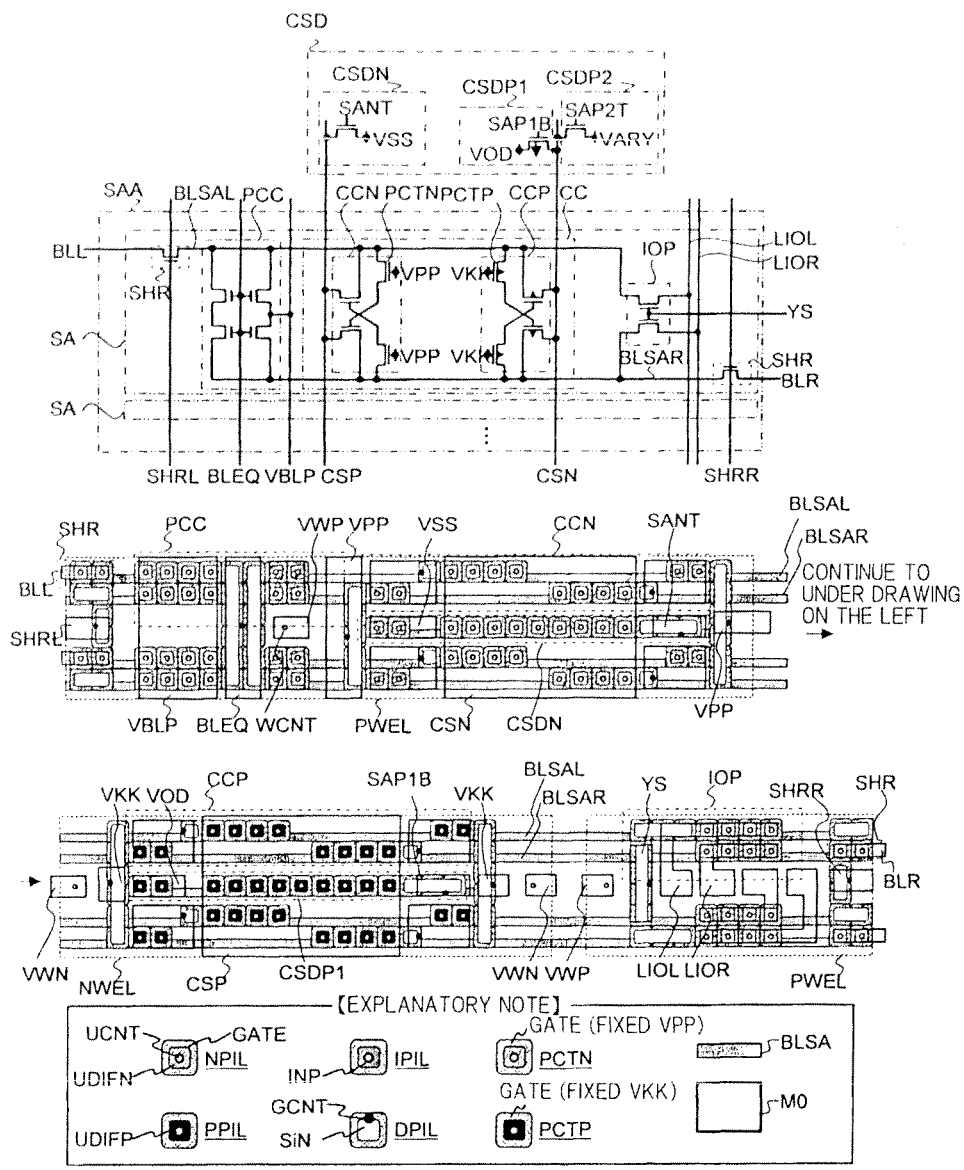
FIG. 24 is a schematic diagram illustrating another example structure of pillar transistors for making contact with in-sense-amplifier bit lines, which are illustrated in FIG. 13.

For pillar transistors IPIL that make contact with in-sense-amplifier bit lines, pillar transistors illustrated in FIG. 21 can be used instead of the configuration illustrated in FIG. 23. In that case, in order to make the pillar transistors IPIL that make contact with in-sense-amplifier bit lines be consistently conductive, the potential of the gate electrode of each pillar transistor may be clamped at a power supply potential VPP or a power supply potential VKK. FIG. 24 illustrates an example of such a circuit and an example layout of the circuit. In the circuit illustrated in FIG. 24, transistors PTCN and PCTP correspond to the pillar transistors IPIL illustrated in FIG. 13. The circuit and configuration illustrated in FIG. 24 is substantially identical to the circuit and configuration illustrated in FIG. 13 except for use of the transistors PTCN and PCTP for pillar transistor IPIL that make contact with in-sense-amplifier bit lines.

FIG. 13 illustrates an example layout in which a p-side common source line driver CSDP1 and an n-side common source line driver CSDN in a common source line driver CSD are distributed in an empty space in a sense amplifier array. Consequently, only a p-side common source line driver CSDP2 for restoration may be arranged in a cross area XP, enabling an area required for the cross area XP to be reduced.

Figure 22:
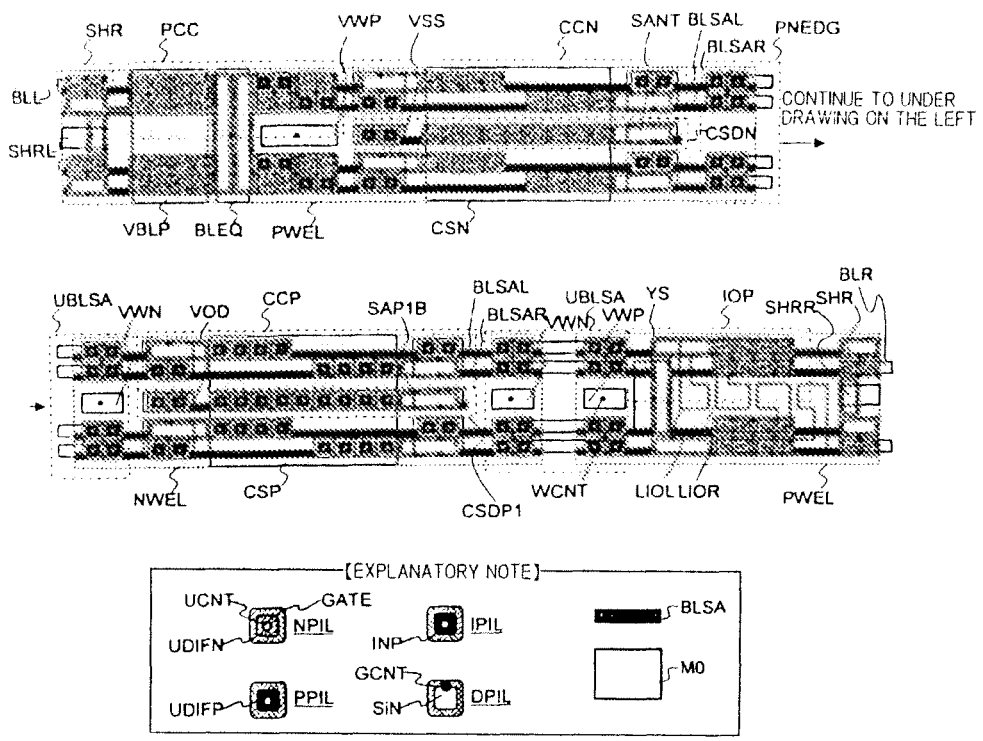
FIG. 22 is a schematic diagram illustrating another example layout of a sense amplifier, bit lines and in-sense-amplifier bit lines, which are illustrated in FIGS. 1A and 1B.

Furthermore, it is possible that the in-sense-amplifier bit lines BLSAL and BLSAR that are illustrated in FIG. 13 are not embedded in a PWEL region or an NWEL region except for parts of the in-sense-amplifier bit lines immediately below an n-channel cross-couple CCN and a p-channel cross-couple CCP, potentials of which most sharply vary when a signal read from a memory cell is amplified. For example, as illustrated in FIG. 22, a configuration in which bit lines are connected to a M0 layer using pillar transistors IPIL that make contact with in-sense-amplifier bit lines and the M0 wiring layer extends across a boundary region PNEDG between a p-well region PWEL and an n-well region NWEL. Such configuration is effective for a case where an in-sense-amplifier bit line layer is formed using doped polysilicon. This is because, where in-sense-amplifier bit lines is formed using doped polysilicon, a material that forms the in-sense-amplifier bit lines becomes p+-poly in a PWEL region and n+ poly in an NWEL region, and thus, the in-sense-amplifier bit lines cannot be directly connected.

Figure 25:
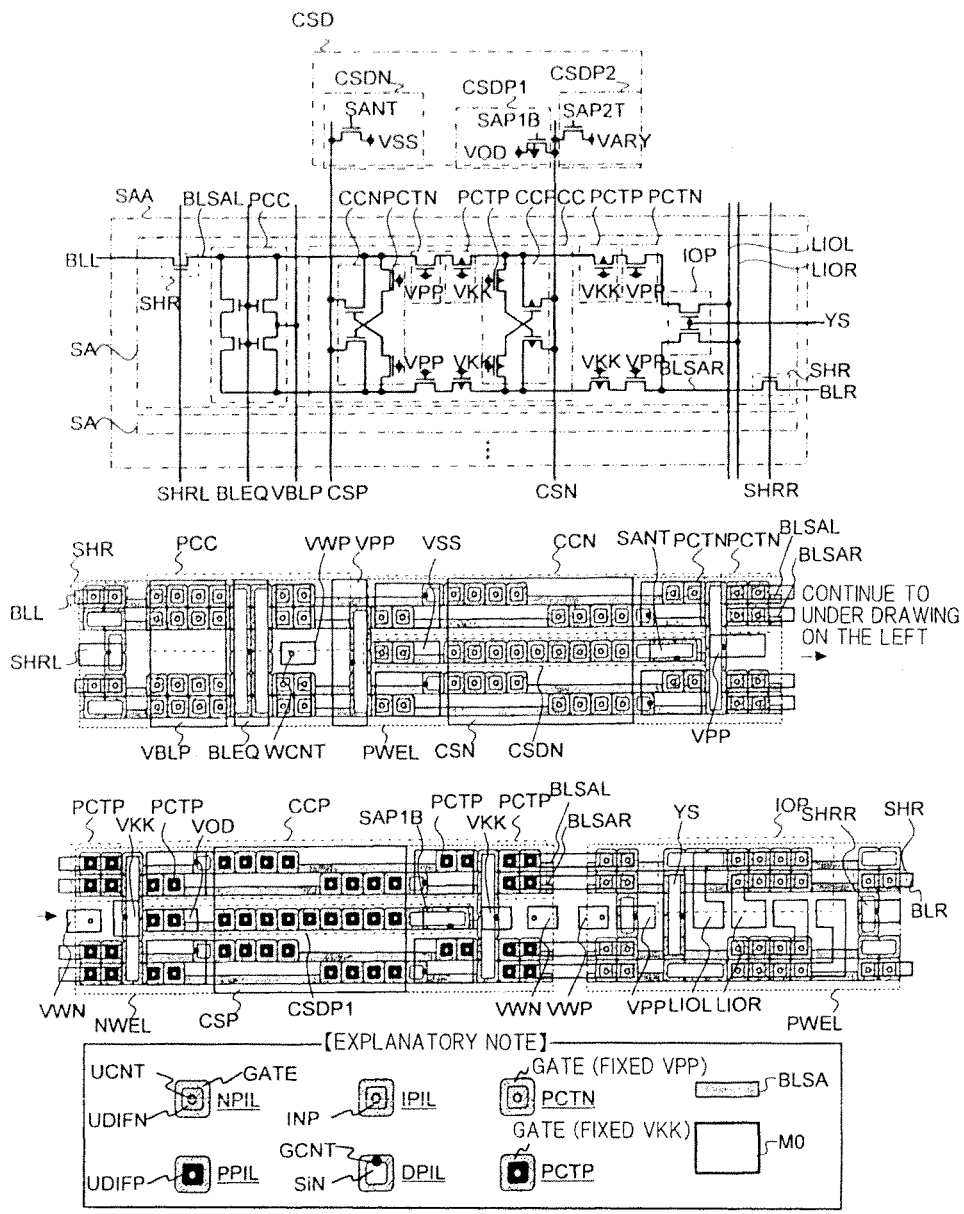
FIG. 25 is a schematic diagram illustrating another example layout of sense amplifiers, bit lines and in-sense-amplifier bit lines, which are illustrated in FIGS. 1A and 1B.

It is also possible that the in-sense-amplifier bit lines BLSAL and BLSAR illustrated in FIG. 24 are not embedded in the PWEL region or the NWEL region except for parts of the in-sense-amplifier bit lines immediately below an n-channel cross couple CCN and an p-channel cross couple CCP, potentials of which most shapely vary when a signal read from a memory cell is amplified. For example, as illustrated in FIG. 25, a configuration in which bit lines are connected to a M0 layer using pillar transistors PCTN or PCTP and the M0 wiring layer extends across a boundary region between a p-well PWEL and an n-well NWEL may be provided. Such configuration is effective for a case where an in-sense-amplifier bit line layer is formed using doped polysilicon. This is because, where in-sense-amplifier bit lines are formed using doped polysilicon, a material that forms in-sense-amplifier bit lines becomes p+ poly in the PWEL region and n+ poly in the NWEL region and thus, the in-sense-amplifier bit lines cannot be directly connected.

Where all or part of shared MOS transistors SHR, an in-sense-amplifier bit line pre-charge and equalization transistor PCC and a read/write port IOP are formed using planar transistors, bit lines connected to such components may be formed at the M0 wiring layer. In such case, the planar transistors can be formed using a known technique, enabling a sense amplifier to be easily fabricated. Also, any of the above configurations provides the advantage of coupling noise between adjacent bit lines being reduced compared to a case where all of the in-sense-amplifier bit lines are formed at a first tungsten layer M0, if the parts of the bit lines immediately below the cross couples CCN and CCP are embedded in a substrate.

As illustrated in FIG. 13, where bit lines BLL and BLR including a metal wiring of, e.g., tungsten or copper and in-sense-amplifier bit lines BLSAL and BLSAR are connected, respectively, vertical shared MOS transistors SHR can be used instead of contacts. As described above, the in-sense-amplifier bit lines BLSAL and BLSAR and the bit lines BLL and BLR are connected using vertical SHR transistors, enabling areas required for contacts to be reduced. Consequently, the area of each sense amplifier can be reduced, enabling provision of small-area memory chips.

Figure 19:
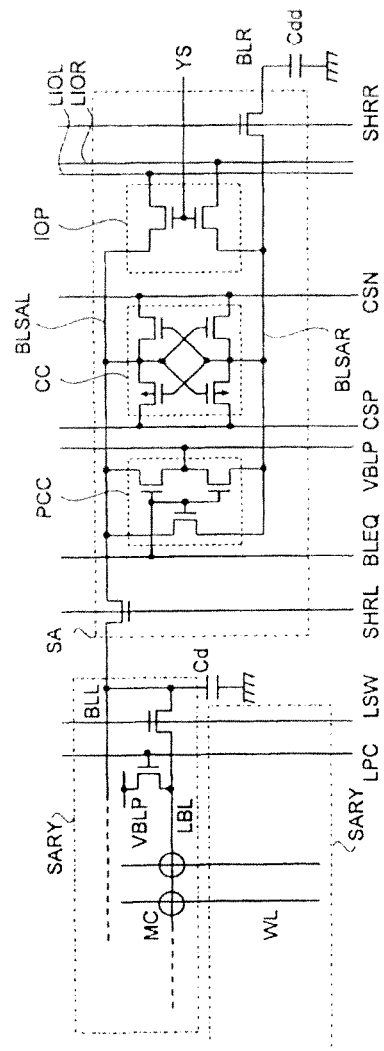
FIG. 19 is a circuit illustrating an example connection between a sense amplifier and a dummy capacity included in the semiconductor memory device illustrated in FIGS. 1A and 1B.

Also, as illustrated in FIG. 19, the semiconductor memory device according to the present exemplary embodiment may employ a latch sensing method in which dummy capacities Cdd each having a capacity substantially equal to the total load capacity of a selected bit line is provided, and in which the dummy capacities Cdd are connected to, for example, respective sense amplifiers in a sense amplifier array SAA.

In such configuration, when a bit line is returned to a pre-charge state after an end of access to a memory cell, if the selected bit line and a reference bit line for the selected bit line are short-circuited, charge re-sharing occurs between the selected bit line and the relevant dummy capacity Cdd. Thus, the bit line can be pre-charged at high speed.

Figure 14:
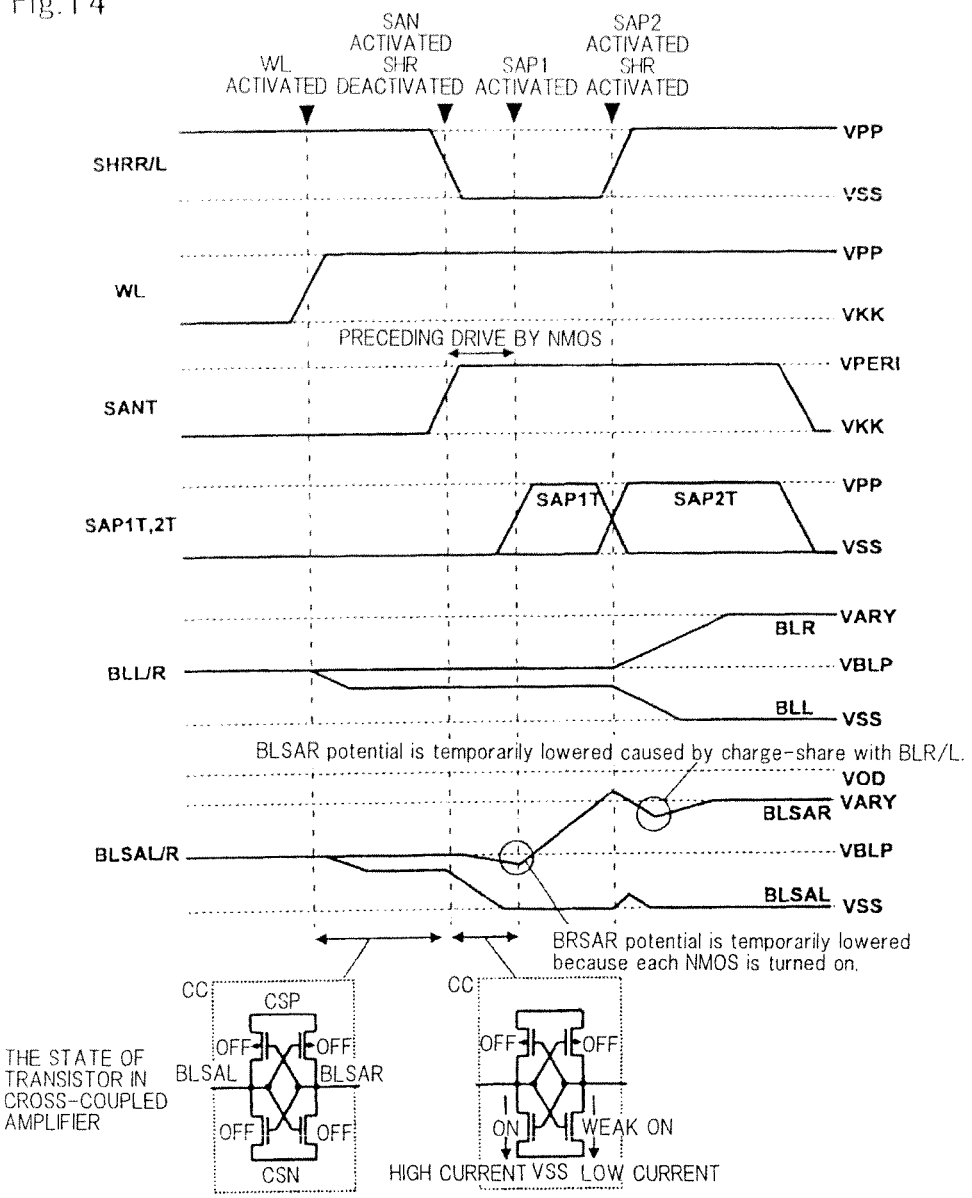
FIG. 14 is a timing chart illustrating an example of operation of a semiconductor memory device according to the present invention.

A timing for making the shared MOS transistors SHR enter an inactive state may be an arbitrary timing during a period of time from activation of a word line and reading of data stored in a memory cell onto a bit line to activation of a sense amplifier. However, as illustrated in FIG. 14, it is desirable that such timing is set to be the same as the timing of activation of an n-side enable signal SANT for a cross-coupled amplifier CC. Employment of such configuration enables inactivation of the shared MOS transistors SHR using the n-side enable signal SANT, and thus, a control circuit for the shared MOS transistors SHR can be simplified, enabling the layout area of the control circuit to be reduced.

Figure 20:
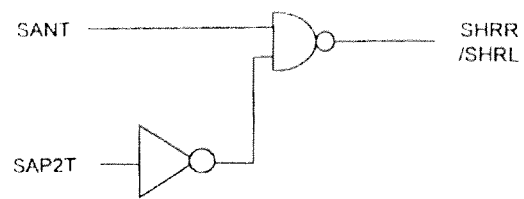
FIG. 20 is a circuit diagram illustrating an example of a control circuit for controlling the shared MOS transistors illustrated in FIG. 6.

More specifically, as illustrated in FIG. 20, a control circuit for the shared MOS transistors SHR includes two logical circuits. Accordingly, the area of the control circuit can be reduced compared to a configuration in which the shared MOS transistors SHR are controlled at another timing such as a SHR control signal being generated using, for example, a delay line.

Also, where activation of the n-side enable signal SANT and inactivation of the shared MOS transistors SHR are set to be performed at different timings, it is necessary to provide separate margins for the respective control timings; however, if both are set to be formed at the same timing, such a necessity is eliminated, enabling easy timing designing.

Also, in the case of a memory array using a bit line overdrive method, as illustrated in FIG. 14, the timing for activating shared MOS transistors SHR after completion of sensing may be set to be the same as timing for activation of a p-side restore enable signal SAP2T for a cross-coupled amplifier CC. The bit line overdrive method is a method in which when data read onto a bit line is amplified, first, the data is amplified at high speed by changing the p-side common source line CSP for a cross-coupled amplifier CC to have a voltage VOD that is higher than an array voltage VARY by activation of a p-side overdrive enable signal SAP1T and at a point of time when the data has sufficiently been amplified, a p-side restore enable signal SAP2T is activated to return the p-side common source line CSP to the voltage VARY, thereby the data is written back in the memory cell.

The p-side restore enable signal SAP2T is activated when BLSAL and BLSAR are sufficiently amplified, and thus, even if SHR are amplified at a timing that is the same as the timing to activate SAP2T to write the data back onto the bit line, there is no possibility of data being inverted by coupling noise between the bit lines.

Accordingly, the shared MOS transistors SHR can be activated using the p-side restore enable signal SAP2T, and thus, a control circuit for SHR can be simplified, enabling the layout area of the control circuit to be reduced.

Where settings are made so that activation of SAP2T and activation of SHR are performed at different timings, it is necessary to provide separate margins for the respective control timings; however, if settings are made so that both are performed at the same timing, such a necessity is eliminated, enabling easy timing designing.

Figure 15:
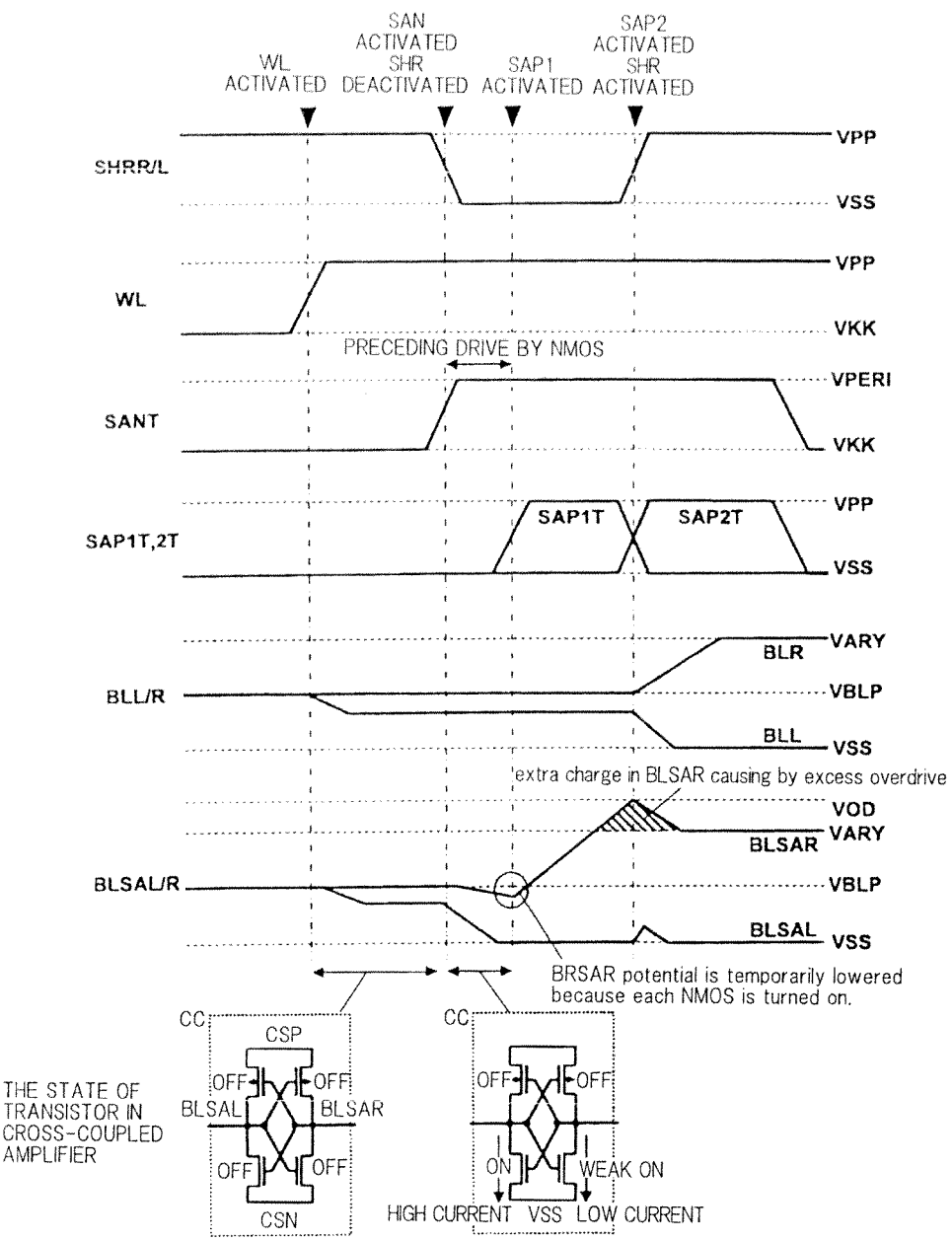
FIG. 15 is a timing chart illustrating another example of operation of a semiconductor memory device according to the present invention.

Furthermore, as illustrated in FIG. 14, when the shared MOS transistors SHR are activated to connect BLSAR and BLR and also to connect BLSAL and BLL, charge re-sharing occurs between BLSAR and BLR, and the potential of BLSAR is temporarily lowered to be lower than the array voltage VARY, which may require a long time for the bit line BLR to be charged to the array voltage. In order to prevent such situation, as illustrated in FIG. 15, SAP2T and SHR may be activated after BLSAR is charged to a sufficiently high voltage. Consequently, BLR can be charged at high speed using the extra charge in BLSAR (the shaded part in FIG. 15), thereby enabling an increase in sensing speed.

Ordinarily, in order to provide high-speed sensing, MOS transistors with a low threshold value are used for a cross-coupled amplifier CC for a sense amplifier. Thus, when n-channel transistors included in the cross-coupled amplifier CC are made to operate ahead, the potentials of the true-side and bar-side bit lines (BLSAL and BLSAR in FIG. 15) are drawn to the low potential (VSS) side from VBLP and temporarily lowered as a result of the two n-channel transistors being turned on simultaneously.

Figure 16:
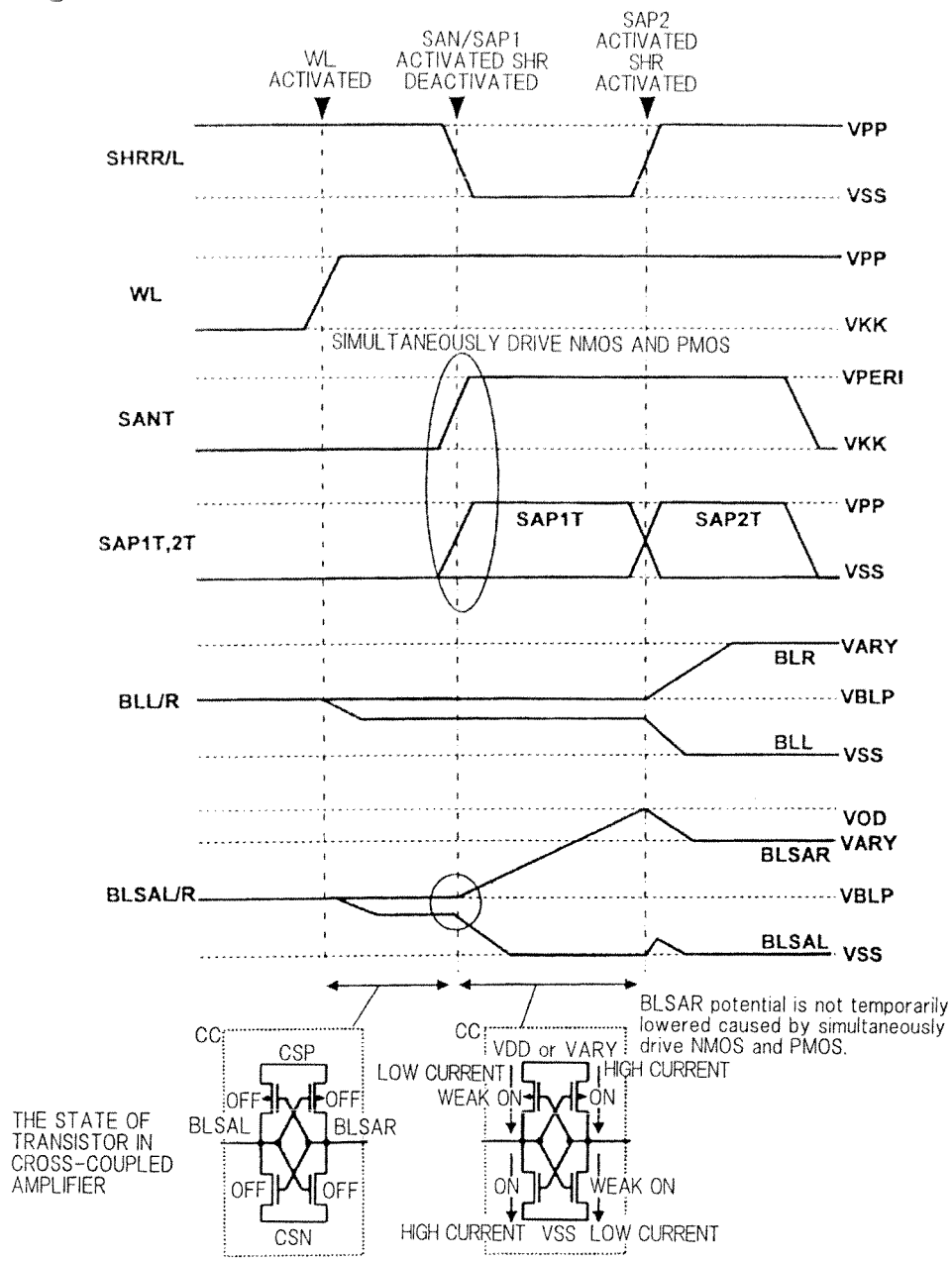
FIG. 16 is a timing chart illustrating another example of operation of a semiconductor memory device according to the present invention.

Meanwhile, as illustrated in FIG. 16, n-channel transistors and p-channel transistors included in a cross-coupled amplifier CC are simultaneously made to operate, the bar-side bit line (BLSAR in FIG. 16) is driven mainly by the p-channel transistors, and thus, the potentials of the true-side and bar-side bit lines (BLSAL and BLSAR in FIG. 16) are drawn to the high potential (VARY or VOD) side. Thus, the potentials of the bit line (BLSAL and BLSAR in FIG. 16) are not lowered from VBLP.

Figure 17:
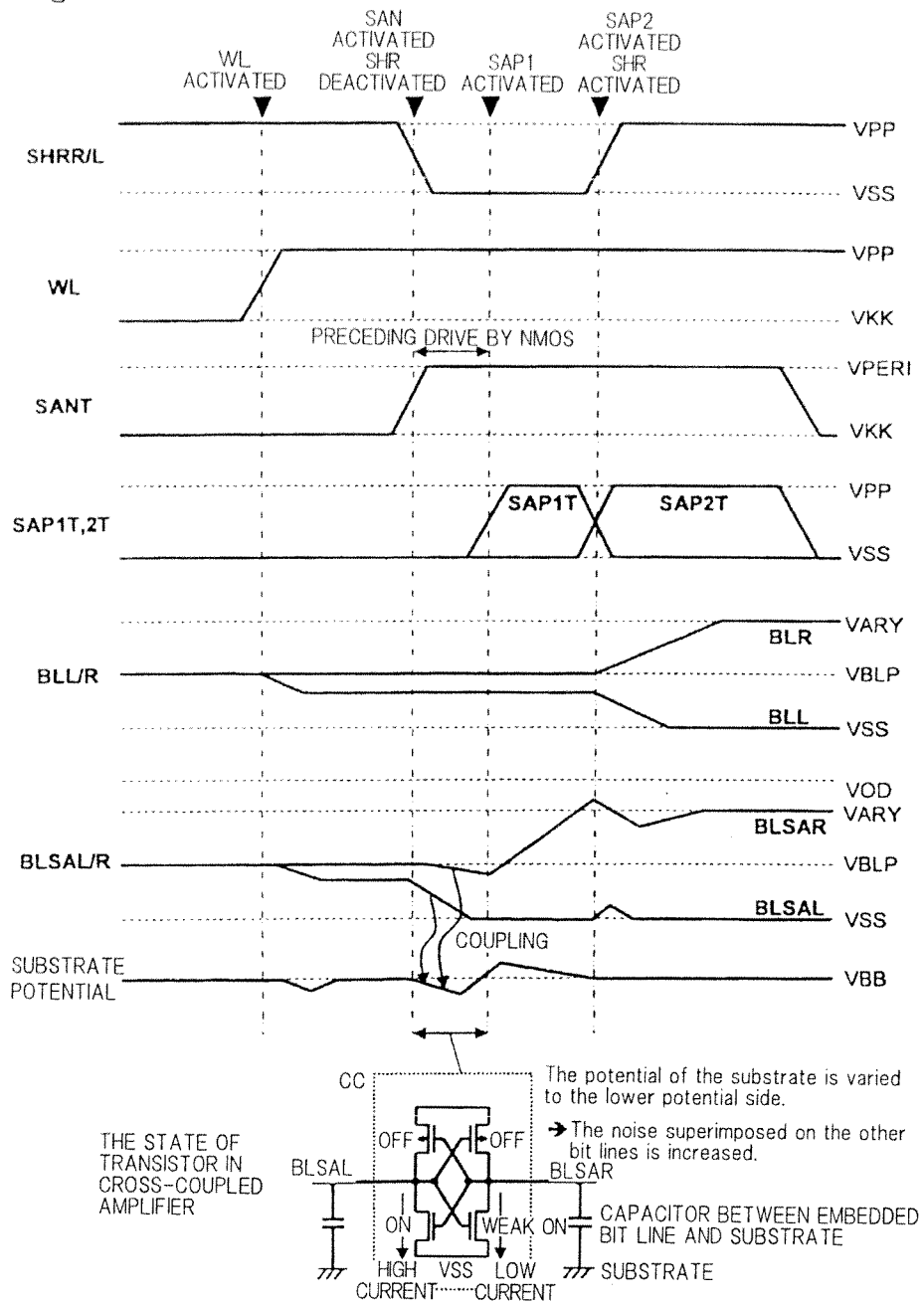
FIG. 17 is a timing chart illustrating another example of operation of a semiconductor memory device according to the present invention.

As described above, when n-channel transistors in a cross-coupled amplifier CC are actuated ahead, the potentials both of the true-side and bar-side bit lines are temporarily lowered. Thus, as illustrated in FIG. 17, the potential of the substrate is varied to the lower potential side also by the coupling capacity between the bit lines and the substrate. Such variation of the potential of the substrate may cause variation of potentials of other bit lines. If the bit line potential is varied in an initial period of sensing, that is, when the bit line potential has not sufficiently been amplified, erroneous sensing may occur, and thus, it is necessary to suppress such variation of the potential of the substrate.

Figure 18:
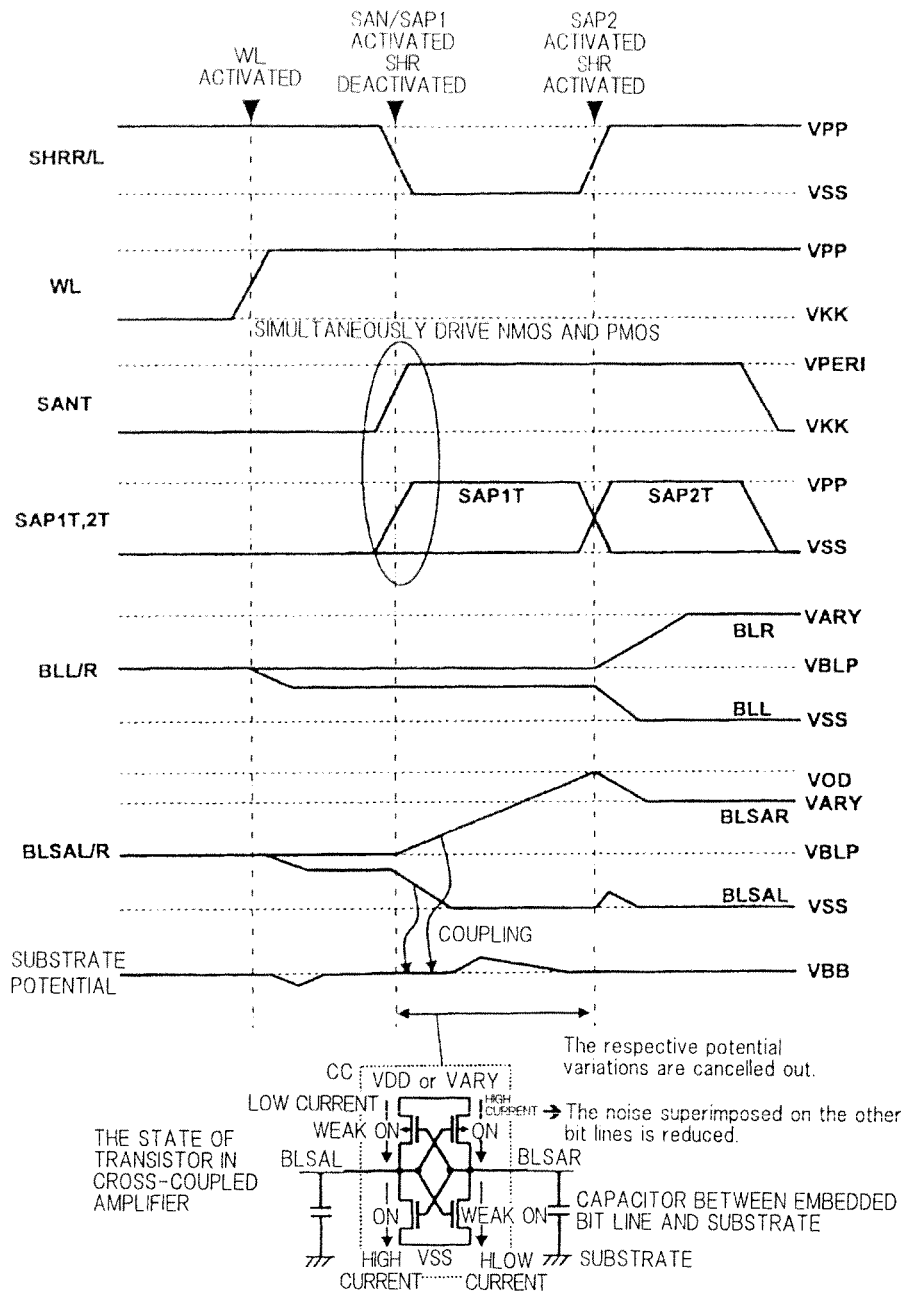
FIG. 18 is a timing chart illustrating another example of operation of a semiconductor memory device according to the present invention.

As illustrated in FIG. 18, when p-channel transistors and n-channel transistors in a cross-coupled amplifier CC are actuated simultaneously, a true signal and a bar signal are amplified in a complementary manner, and the respective potential variations are cancelled out, suppressing coupling noise in the potential of the substrate. Consequently, variation in potential of the substrate is reduced, and noise superimposed on the other bit lines is thereby reduced. Consequently, a more stable sensing operation can be provided.

Although the inventions has been described above in connection with several preferred embodiments thereof, it will be appreciated by those skilled in the art that those embodiments are provided solely for illustrating the invention, and should not be relied upon to construe the appended claims in a limiting sense.

(Appendix 1)

A semiconductor memory device comprising:

a sense amplifier;

a plurality of memory cell arrays;

a shared MOS transistor that connects/disconnects the sense amplifier and a bit line included in the memory cell arrays; and a control circuit that controls operation of the shared MOS transistor, wherein a part or whole of an in-sense-amplifier bit line that is a bit line connecting the sense amplifier and the shared MOS transistor is embedded in a semiconductor substrate.

(Appendix 2)

The semiconductor memory device according to appendix 1, wherein the sense amplifier includes a cross-coupled amplifier that amplifies a minute differential voltage corresponding to data stored in a memory cell and latches a value of the amplified differential voltage;

wherein the in-sense-amplifier bit line arranged below the cross-coupled amplifier is embedded in the semiconductor substrate.

(Appendix 3)

The semiconductor memory device according to appendix 2, comprising a p-well region in which a p-type impurity is distributed and an n-well region in which an n-type impurity is distributed, in the semiconductor substrate, wherein the p-well region and the n-well region are connected via a wiring layer for supplying power to the p-well region and the n-well region and a contact, the wiring layer and the contact being formed above the semiconductor substrate.

(Appendix 4)

The semiconductor memory device according to appendix 2 or 3, wherein the in-sense-amplifier bit line is embedded in a p-well region or an n-well region.

(Appendix 5)

The semiconductor memory device according to any one of appendices 1 to 4, wherein the bit line and the in-sense-amplifier bit line are connected via a vertical shared MOS transistor.

(Appendix 6)

The semiconductor memory device according to any one of appendices 1 to 5, comprising a plurality of dummy capacities each equal to a total load capacity of the bit line, wherein a dummy capacity from among the dummy capacities is connected to the sense amplifier arranged at an end portion of the memory cell arrays.

(Appendix 7)

The semiconductor memory device according to any one of appendices 1 to 6, wherein the cross-coupled amplifier includes two inverters each including an n-channel transistor and a p-channel transistor, an output signal from one of the two inverters being fed back to an input of another of the two inverters; and wherein the shared MOS transistor is inactivated at a timing that is the same as a timing for activation of the n-channel transistors included in the cross-coupled amplifier.

(Appendix 8)

The semiconductor memory device according to any one of appendices 1 to 6, wherein the cross-coupled amplifier includes two inverters each including an n-channel transistor and a p-channel transistor, an output signal from one of the two inverters being fed back to an input of another of the two inverters; and wherein the control circuit activates the shared MOS transistor at a timing that is the same as a timing for activation of a p-side restore enable signal.

(Appendix 9)

The semiconductor memory device according to any one of appendices 1 to 6, wherein the cross-coupled amplifier includes two inverters each including an n-channel transistor and a p-channel transistor, an output signal from one of the two inverters being fed back to an input of another of the two inverters; and wherein the control circuit inactivates the shared MOS transistor at a timing that is the same as a timing for activation of the n-channel transistors and the p-channel transistors included in the cross-coupled amplifier.

(Appendix 10)

The semiconductor memory device according to any one of appendices 1 to 9, wherein the control circuit activates the shared MOS transistor after amplification of a minute differential voltage, corresponding to data stored in a memory cell, by the sense amplifier to a voltage that is higher than a voltage supplied to the memory cell arrays.

(Appendix 11)

The semiconductor memory device according to any one of appendices 1 to 10, wherein the control circuit acquires in advance a column address to be accessed, using a posted CAS method.

(Appendix 12)

A device comprising:

a first memory sub array including first and second bit lines;

first and second amplifier areas arranged to sandwich the memory sub array therebetween;

a first amplifier circuit disposed in the first amplifier area, coupled to the first bit lines, and receiving a first control signal, the first amplifier circuit being activated when the first control signal is activated; and a second amplifier circuit disposed in the second amplifier area, coupled to the second bit lines, and receiving a second control signal different from the first control signal, the second amplifier circuit being activated when the second control signal is activated, the second control signal being activated independently of the first control signal.

(Appendix 13)

The device as described in appendix 12, further comprising, a second memory sub array disposed on opposite side to the first memory sub array with respect to the first amplifier area, including a third bit line, a second memory sub array disposed on opposite side to the first memory sub array with respect to the second amplifier area, including a fourth bit line, a first precharge circuit coupled between the first and the third bit lines, receiving a first precharge signal, the first precharge circuit being activated, when the first precharge signal is activated, to connect the first and the third bit lines to each other, and a second precharge circuit coupled between the second and the fourth bit lines, receiving a second precharge signal, the second precharge circuit being activated, when the second precharge signal is activated, to connect the second and the fourth bit lines to each other, the second precharge signal being activated independently of the first precharge signal.

(Appendix 14)

The device as described in appendix 12, further comprising first and second switches, and wherein the first amplifier includes first input node, the first switch being coupled between the first input node of the first amplifier circuit and the first bit line and receiving a first switch signal, wherein the first switch is rendered conductive when the first switch signal is activated, the second amplifier including second input node, the second switch being coupled between the second input node of the second amplifier circuit and the second bit line and receiving a second switch signal different from the first switch signal, wherein the second switch is rendered conductive when the second switch is activated, the second switch being activated independently of the first switch signal.

(Appendix 15)

The device as described in appendix 12, wherein the first memory sub array includes first and second local bit lines each coupled to a plurality of memory cells, the first memory sub array further including first and second local switches, the first local switch being coupled between the first bit line and the first local bit line and receiving a first local switch signal, the first local switch being rendered conductive when the first local switch signal is activated, the second local switch being coupled between the second bit line and the second local bit line and receiving a second local switch signal, the second local switch being rendered conductive when the second local switch signal is activated, the second local switch signal being activated independently of the first local switch signal.

What is claimed is:

1. A device, comprising:
   a semiconductor substrate;
   first and second bit lines formed in the semiconductor substrate;
   first and second conductive lines formed over the semiconductor substrate;
   a first signal line configured to convey a first control signal that changes between first and second logic levels;
   a first power line configured to convey a first power supply voltage that is a substantially constant level;
   a first transistor forming a part of a sense amplifier, the first transistor including a first pillar element that comprises a first diffusion layer at one end thereof and a second diffusion layer at an other end thereof, and a first gate electrode that surrounds a part of the first pillar element, the first diffusion layer being coupled to the first bit line, the second diffusion layer being coupled to the first conductive line, and the first gate electrode being coupled to the first signal line; and
   a second transistor forming another part of the sense amplifier, the second transistor including a second pillar element that comprises a third diffusion layer at one end thereof and a fourth diffusion layer at an other end thereof, and a second gate electrode that surrounds a part of the second pillar element, the third diffusion layer being coupled to the second bit line, the fourth diffusion layer being coupled to the second conductive line, and the second gate electrode being coupled to the power line.

2. The device as claimed in claim 1, wherein the second pillar element of the second transistor includes a diffusion portion electrically connecting the third diffusion layer thereof to the fourth diffusion layer thereof.

3. The device as claimed in claim 1, wherein the first pillar element of the first transistor is substantially equal in size to the second pillar element of the second transistor.

4. The device as claimed in claim 1, wherein the first conductive line is configured to convey a second power supply voltage that is different in level from the first power supply voltage.

5. The device as claimed in claim 4, wherein the second power supply voltage is a substantially half level of the first power supply voltage.

6. The device as claimed in claim 1, wherein the first and second conductive lines are formed as the same level wiring layer.

7. A device, comprising:
   a semiconductor substrate;
   first and second bit lines formed in the semiconductor substrate;
   a first power line configured to convey a first power supply voltage;
   a first transistor forming a part of a sense amplifier, the first transistor including a first pillar element that comprises a first diffusion layer at one end thereof and a second diffusion layer at an other end thereof, and a first gate electrode that surrounds a part of the first pillar element, the first diffusion layer being coupled to the first bit line; and
   a second transistor forming another part of the sense amplifier, the second transistor including a second pillar element that comprises a third diffusion layer at one end thereof and a fourth diffusion layer at an other end thereof, and a second gate electrode that surrounds a part of the second pillar element, the third diffusion layer being coupled to the second bit line, the fourth diffusion layer being coupled to the first gate electrode of the first transistor, and the second gate electrode being coupled to the first power line.

8. The device as clamed in claim 7, wherein the second pillar element of the second transistor includes a diffusion portion electrically connecting the third and fourth diffusion layers.

9. The device as claimed in claim 7, further comprising:
   a first insulating layer formed over the semiconductor substrate to cover the first and second transistors; and
   a first conductive line formed on the first insulating layer and coupled to the first gate electrode of the first transistor at one end and coupled to the fourth diffusion layer of the second transistor at an other end.

10. The device as claimed in claim 9, further comprising:
    a third transistor including a third pillar element that comprises a fifth diffusion layer at one end thereof and a sixth diffusion layer at an other end thereof, and a third gate electrode that surrounds a part of the third pillar element, the fifth diffusion layer being coupled to the second bit line; and
    a second conductive line formed on the first insulating layer and insulating from the first conductive line, the second conductive line being coupled to the second diffusion layer of the first transistor and the sixth diffusion layer.

11. The device as claimed in claim 10, further comprising:
    a fourth transistor including a fourth pillar element that comprises a seventh diffusion layer at one end thereof and a eighth diffusion layer at an other end thereof, and a fourth gate electrode that surrounds a part of the fourth pillar element, the seventh diffusion layer being coupled to the first bit line, the eighth diffusion layer being coupled to the third gate electrode of the third transistor, and the fourth gate electrode being coupled to the first power line.

12. The device as claimed in claim 11, wherein each of the first, second, third and fourth transistors comprises a first conductivity type transistor.

13. The device as claimed in claim 11, further comprising:
    a second power line configured to convey a second power supply voltage;
    a fifth transistor of a second conductivity type including a fifth pillar element that comprises a ninth diffusion layer at one end thereof and a tenth diffusion layer at an other end thereof, and a fifth gate electrode that surrounds a part of the fifth pillar element, the ninth diffusion layer being coupled to the first bit line; and
    a sixth transistor of the second conductivity type including a sixth pillar element that comprises a eleventh diffusion layer at one end thereof and a twelfth diffusion layer at an other end thereof, an a sixth gate electrode that surrounds a part of the sixth pillar element, the eleventh diffusion layer being coupled to the second bit line, the twelfth diffusion layer being coupled to the fifth gate electrode of the fifth transistor, and the sixth gate electrode being coupled to a second power line.

14. The device as clamed in claim 13, wherein the sixth pillar element of the sixth transistor includes a diffusion portion electrically connecting the eleventh and twelfth diffusion layers.

15. The device as claimed in claim 13, further comprising a third conducive line formed on the first insulating layer, insulating from the first and second conductive line and coupled to the fifth gate electrode of the fifth transistor at one end and coupled to the twelfth diffusion layer of the sixth transistor at an other end.

16. The device as claimed in claim 15, further comprising:
a seventh transistor of the second conductivity type including a seventh pillar element that comprises a thirteenth diffusion layer at one end thereof and a fourteenth diffusion layer at an other end thereof, and a seventh gate electrode that surrounds a part of the seventh pillar element, the thirteenth diffusion layer being coupled to the second bit line; and
a fourth conductive line formed on the first insulating layer and insulating from the first, second and third conductive lines, the fourth conductive line being coupled to the tenth diffusion layer and the fourteenth diffusion layer.

17. The device as claimed in claim 16, further comprising:
a eighth transistor of the second conductivity type including a eighth pillar element that comprises a fifteenth diffusion layer at one end thereof and a sixteenth diffusion layer at an other end thereof, and a eighth gate electrode that surrounds a part of the eighth pillar element, the fifteenth diffusion layer being coupled to the first bit line, the sixteenth diffusion layer being coupled to the seventh gate electrode of the seventh transistor, and the eighth gate electrode being coupled to the second power line.

18. The device as claimed in claim 17, wherein the first, third, fifth, and seventh transistors serve as a sense amplifier circuit.

19. The device as claimed in claim 7, wherein the first and second bit lines are complementary with each other.

20. The device as claimed in claim 7, wherein the first pillar element of the first transistor is substantially equal in size to the second pillar element of the second transistor.

* * * * *